(12) United States Patent
Xie et al.

(10) Patent No.: US 9,153,694 B2
(45) Date of Patent: Oct. 6, 2015

(54) METHODS OF FORMING CONTACT STRUCTURES ON FINFET SEMICONDUCTOR DEVICES AND THE RESULTING DEVICES

(71) Applicant: GLOBALFOUNDRIES Inc., Grand Cayman, KY (US)

(72) Inventors: Ruilong Xie, Niskayuna, NY (US); Ryan Ryoung-Han Kim, Albany, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 55 days.

(21) Appl. No.: 14/017,781

(22) Filed: Sep. 4, 2013

(65) Prior Publication Data
US 2015/0060960 A1 Mar. 5, 2015

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 2005/0051825 A1* | 3/2005 | Fujiwara et al. | 257/308 |
| 2014/0273397 A1* | 9/2014 | Rodder et al. | 438/400 |
| 2014/0374827 A1* | 12/2014 | Suh et al. | 257/347 |

* cited by examiner

*Primary Examiner* — Yu Chen
*Assistant Examiner* — Nilufa Rahim
(74) *Attorney, Agent, or Firm* — Amerson Law Firm, PLLC

(57) ABSTRACT

A method includes forming a raised isolation structure with a recess above a substrate, forming a gate structure above the fin, forming a plurality of spaced-apart buried fin contact structures within the recess that have an outer perimeter surface that contacts at least a portion of an interior perimeter surface of the recess and forming at least one source/drain contact structure for each of the buried fin contact structures. One device includes a plurality of spaced-apart buried fin contact structures positioned within a recess in a raised isolation structure on opposite sides of a gate structure. The upper surface of each of the buried fin contact structures is positioned below an upper surface of the raised isolation structure and an outer perimeter surface of each of the buried fin contact structures contacts at least a portion of an interior perimeter surface of the recess.

21 Claims, 24 Drawing Sheets

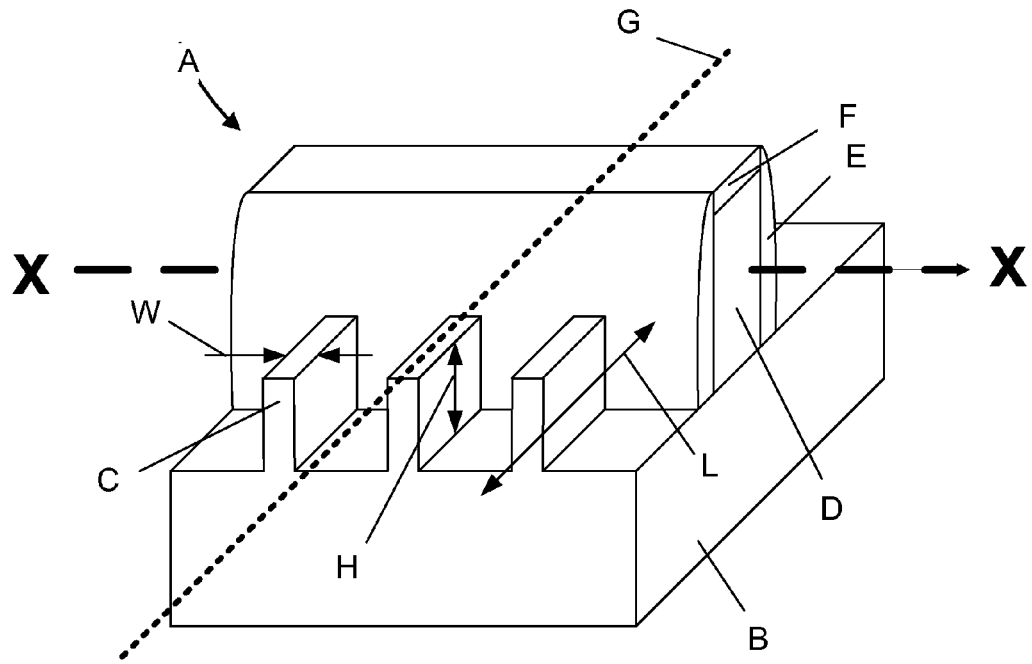
Figure 1A (Prior Art)
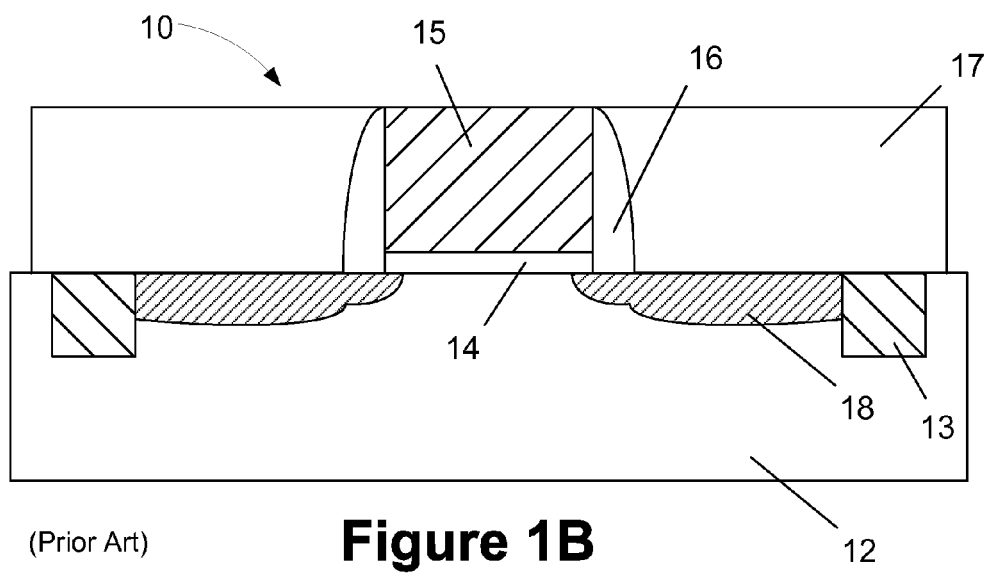
(Prior Art) Figure 1B

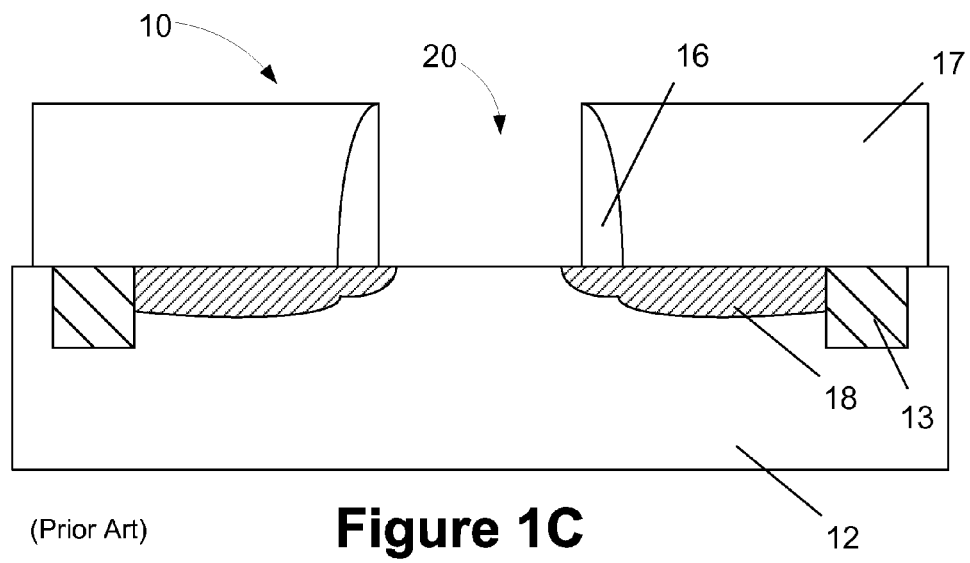
(Prior Art) Figure 1C
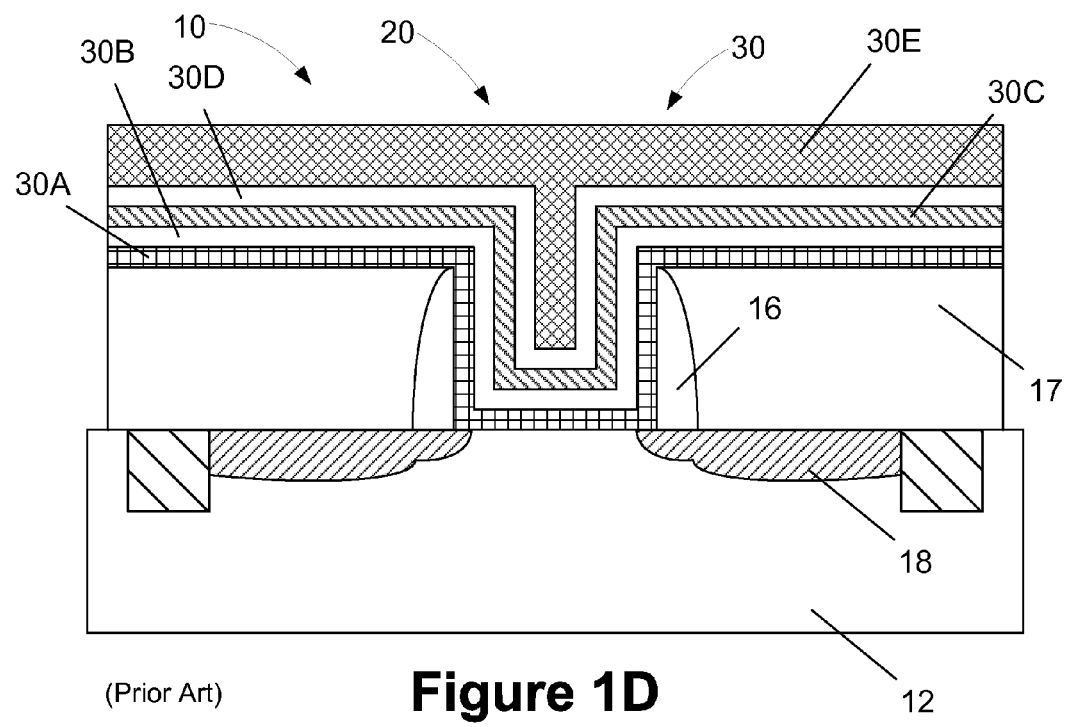
(Prior Art) Figure 1D

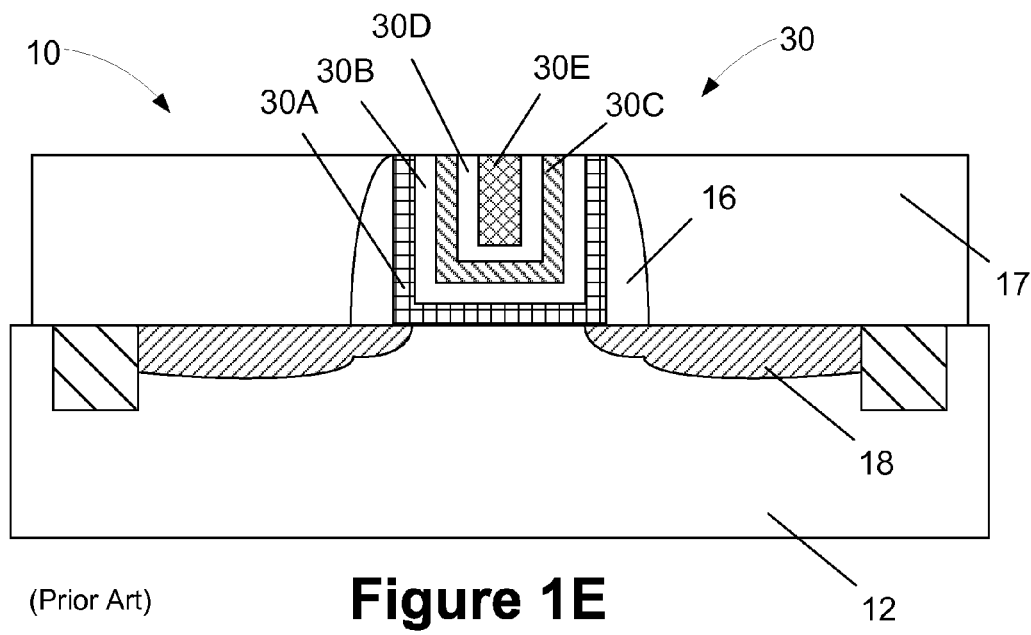
(Prior Art) Figure 1E
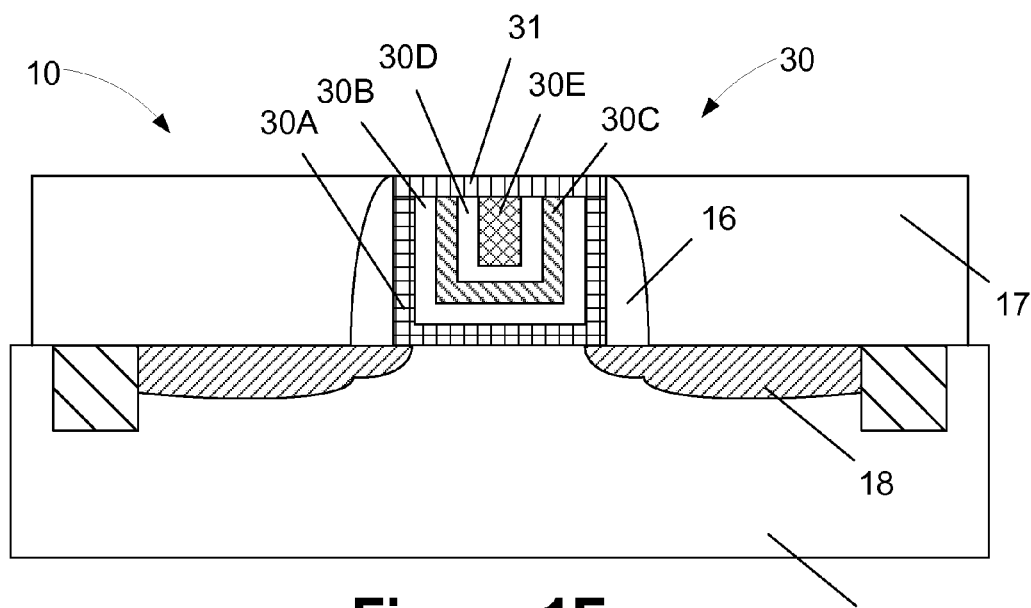
(Prior Art) Figure 1F

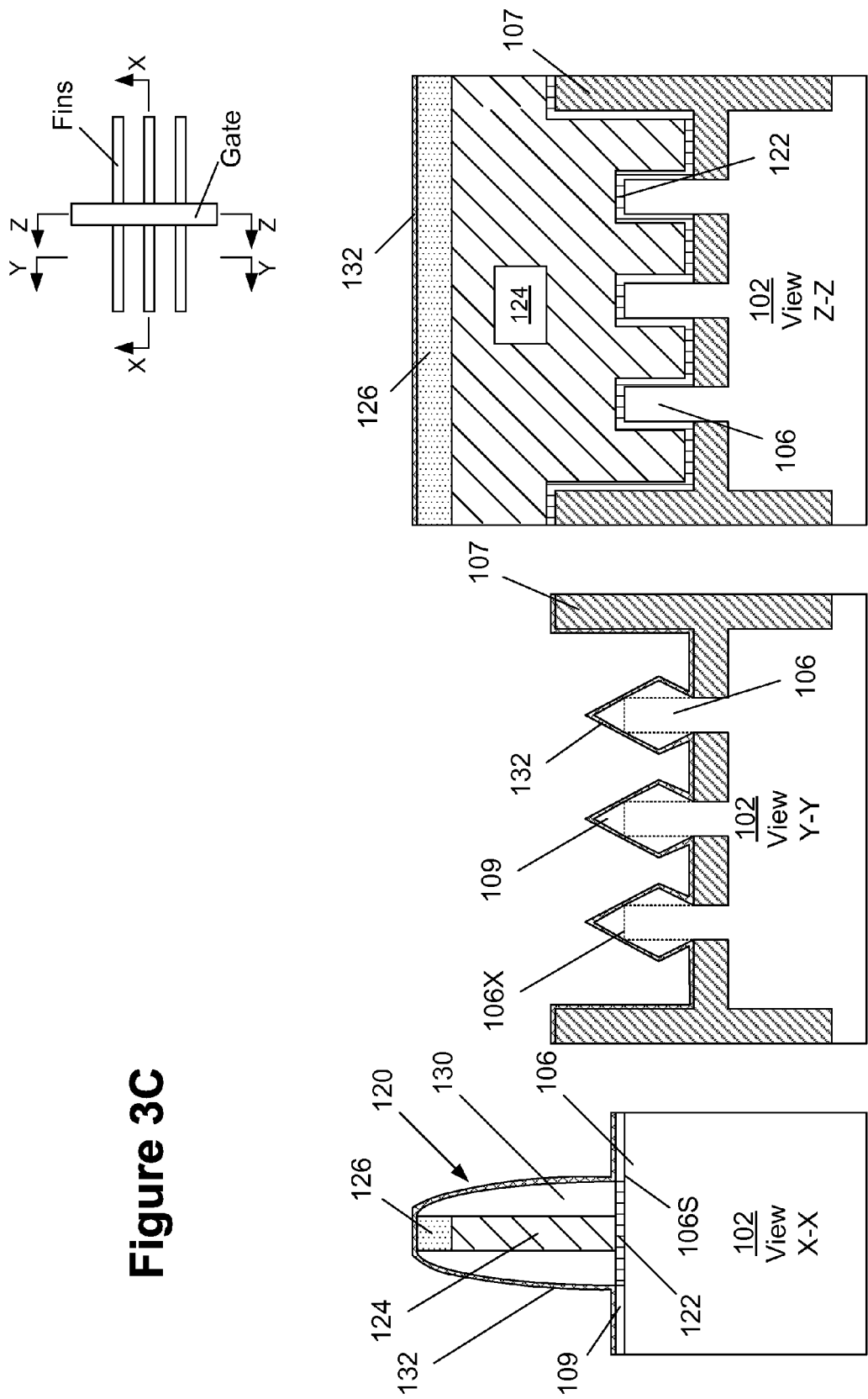

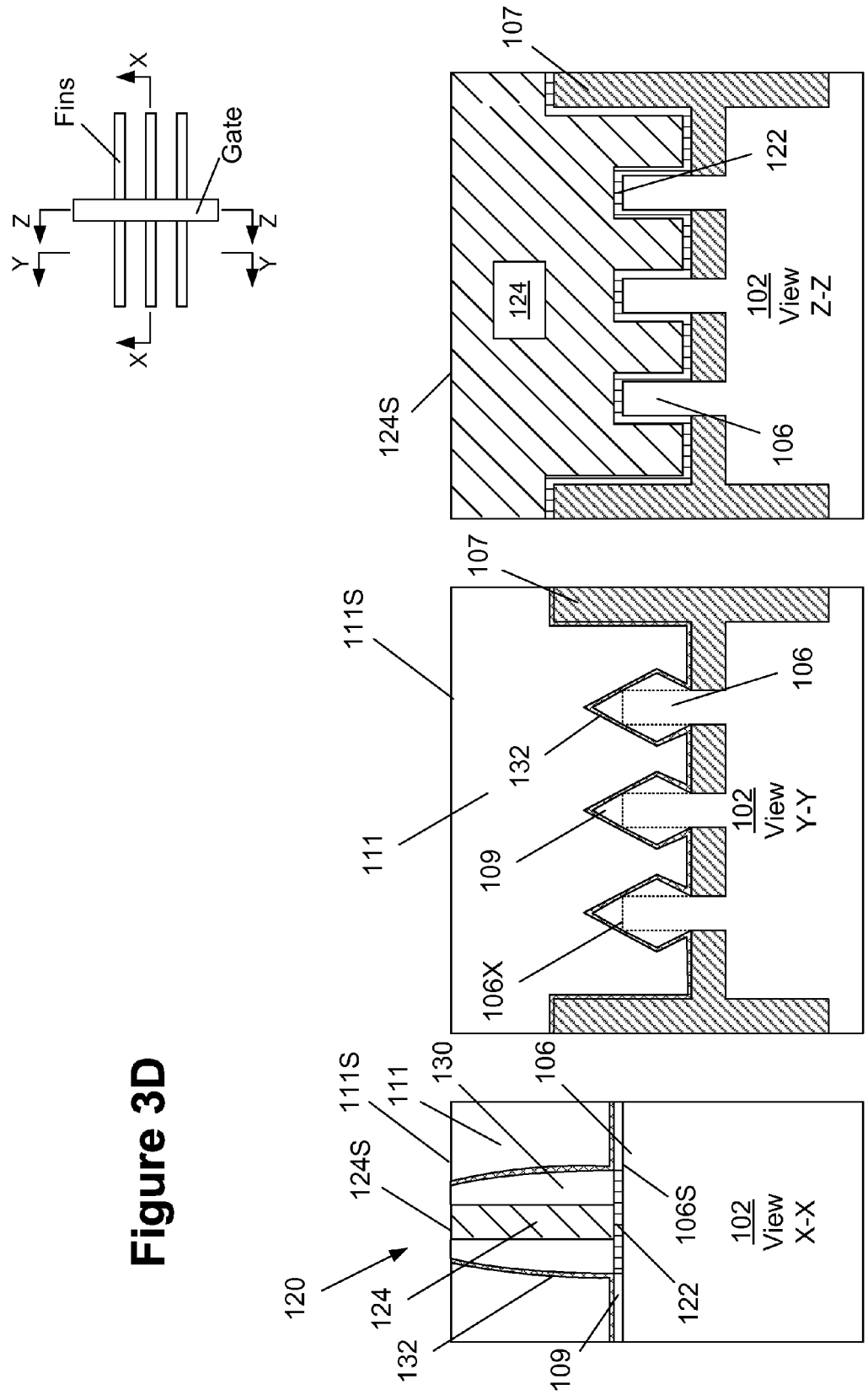

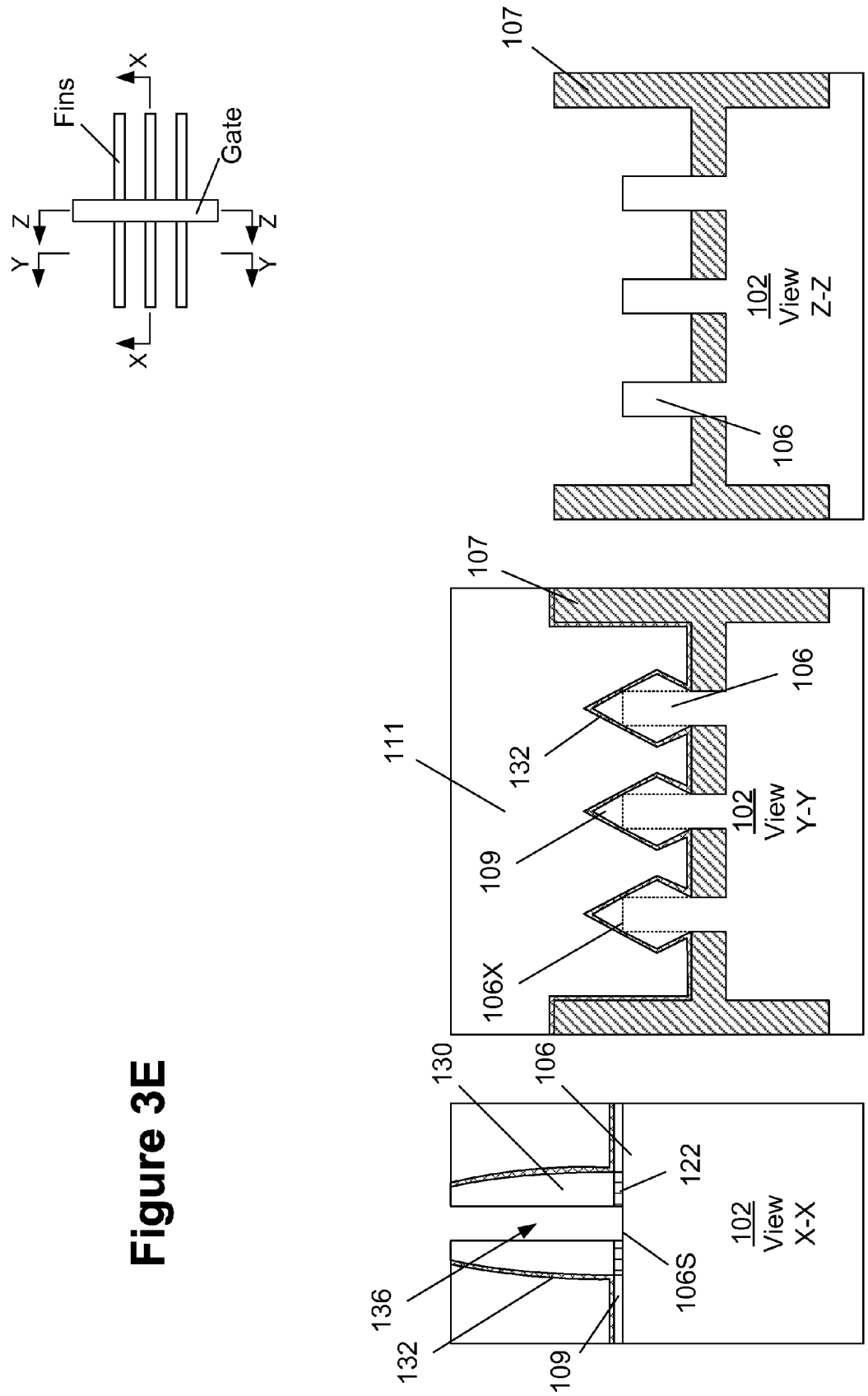

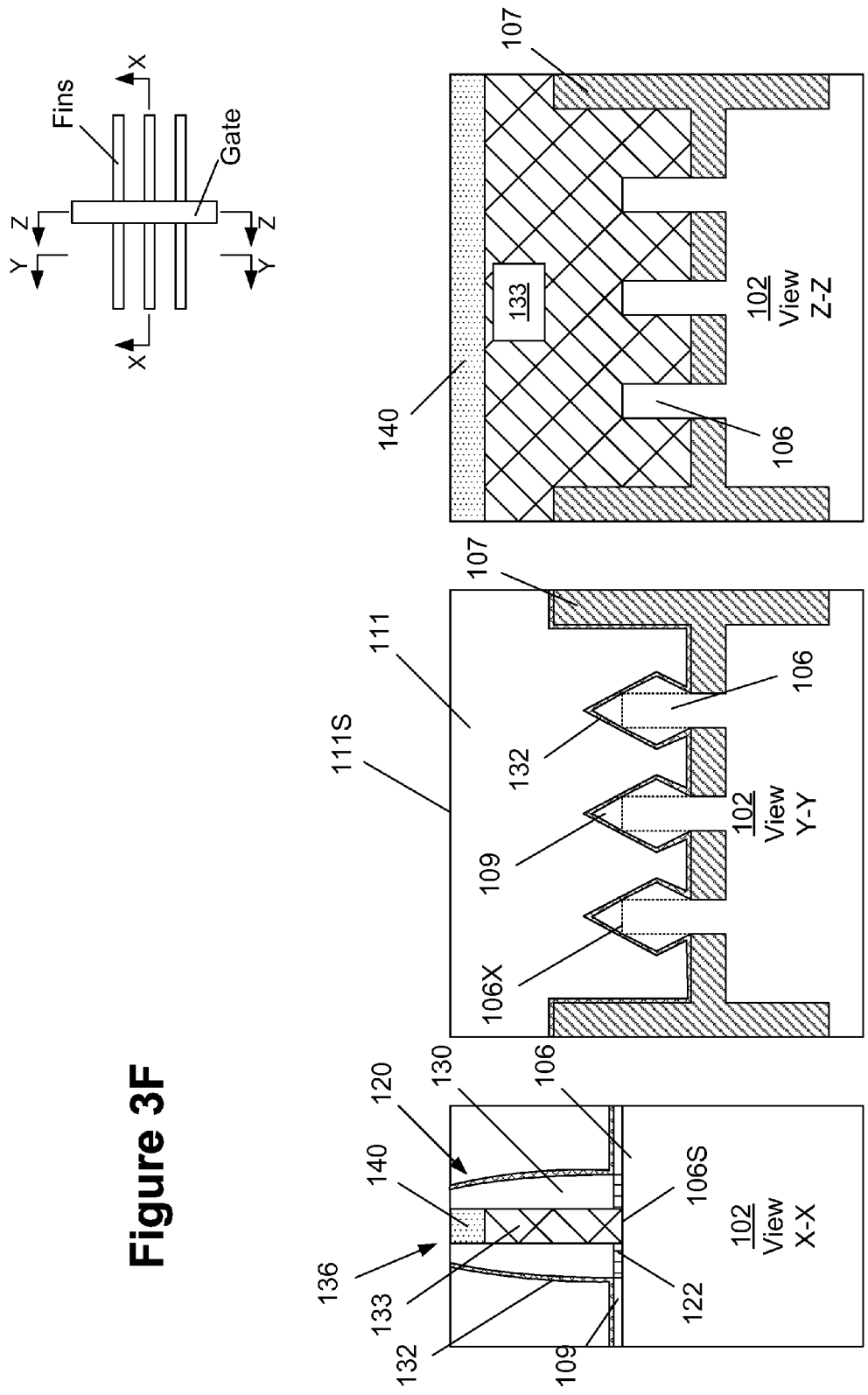

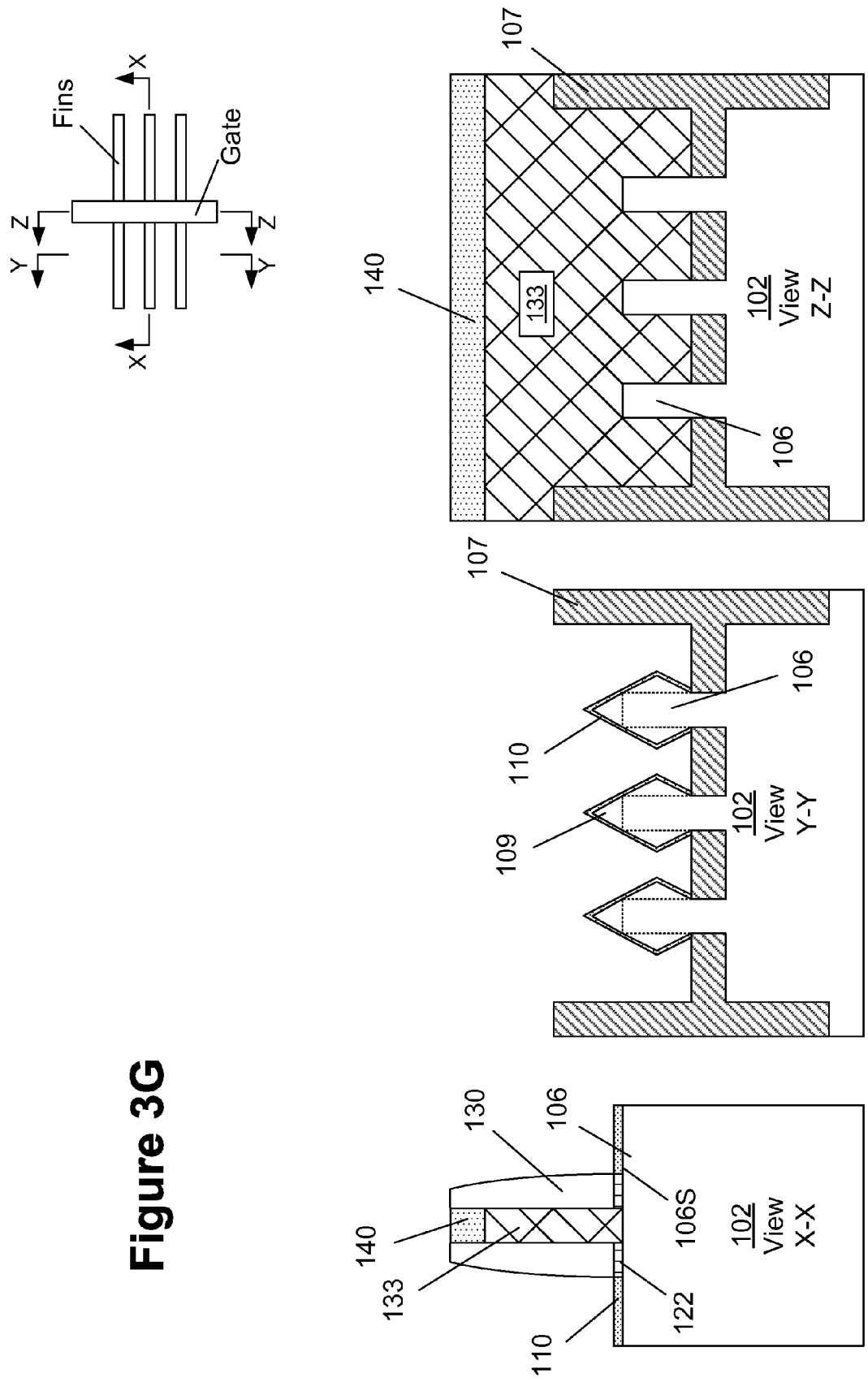

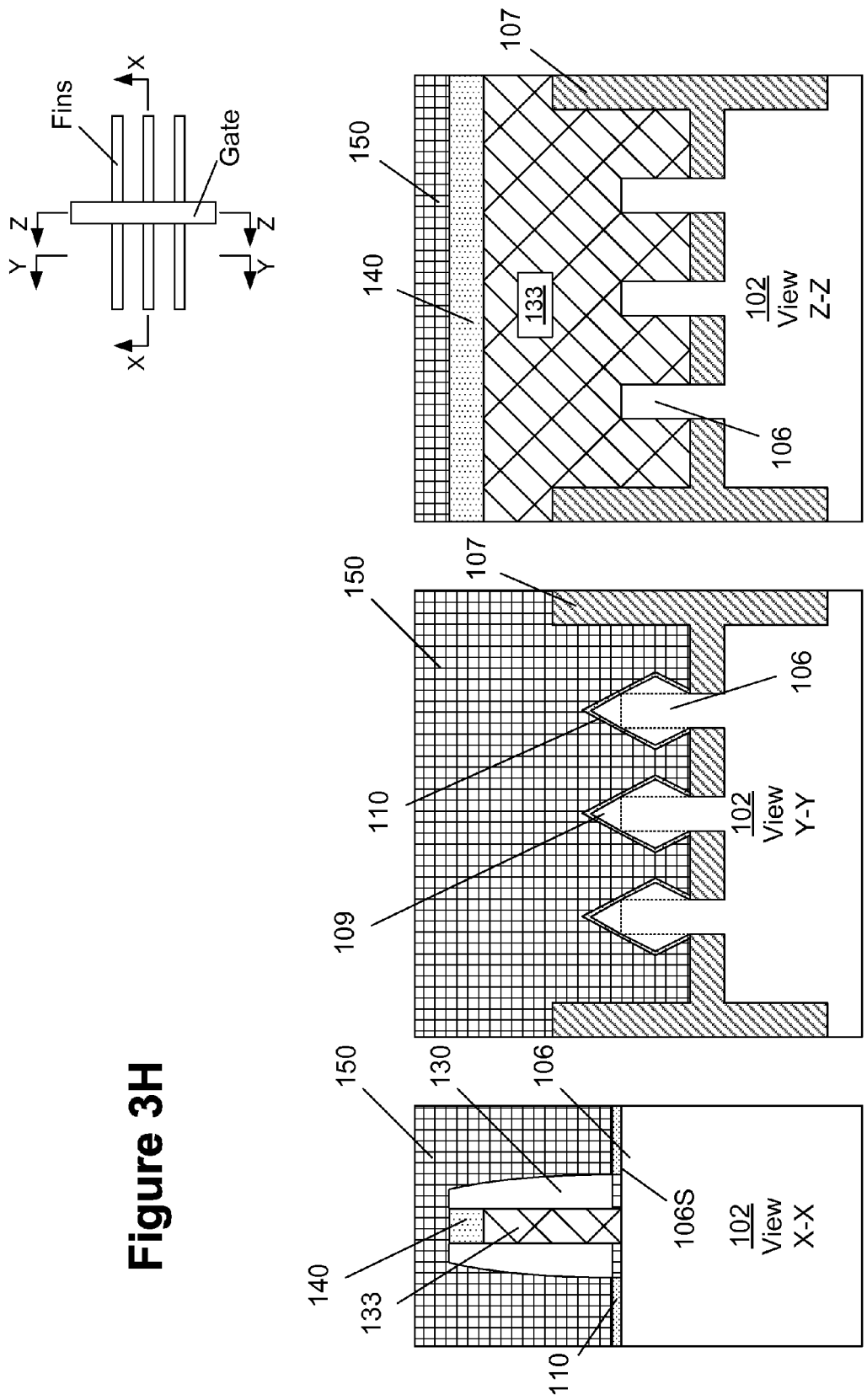

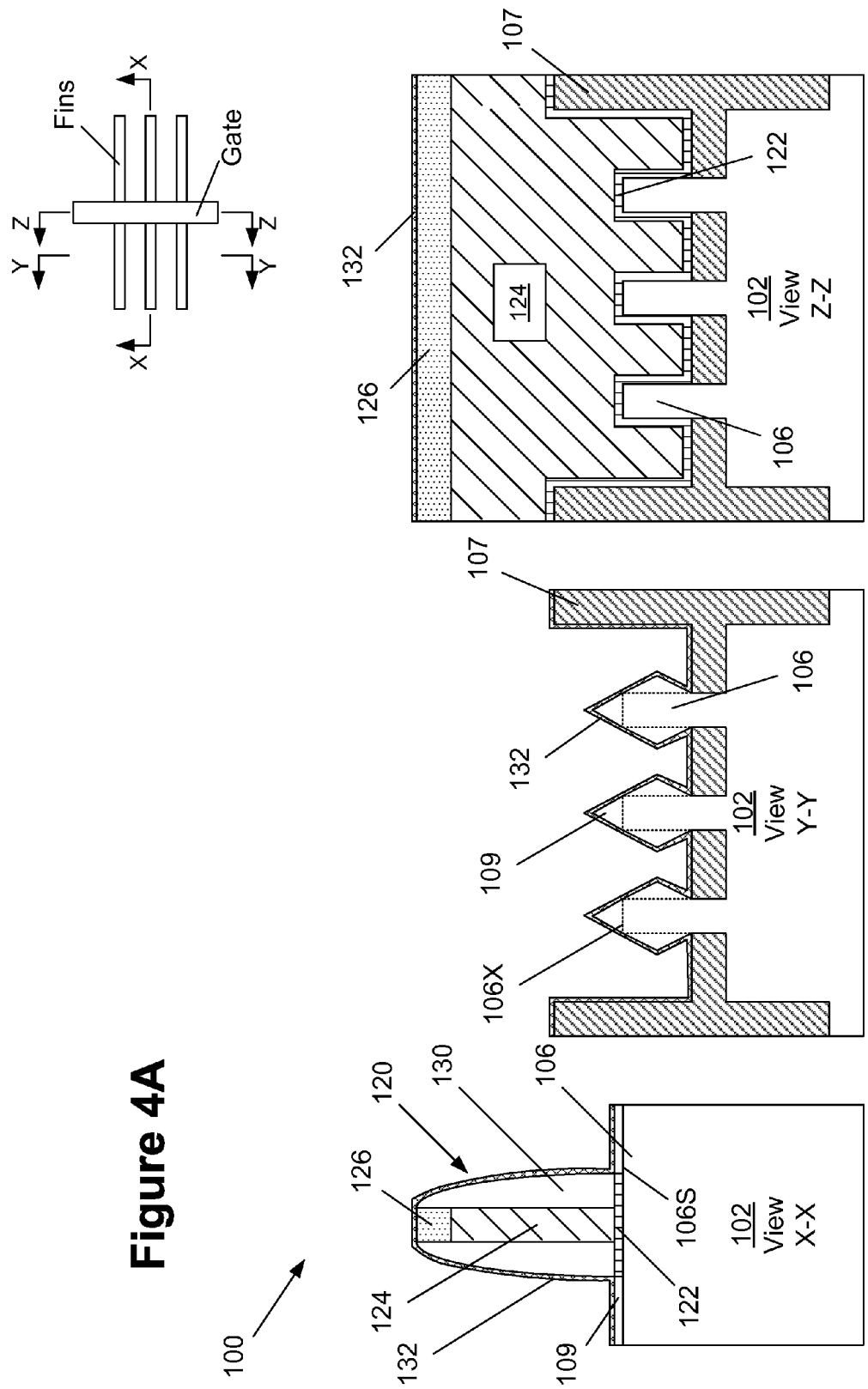

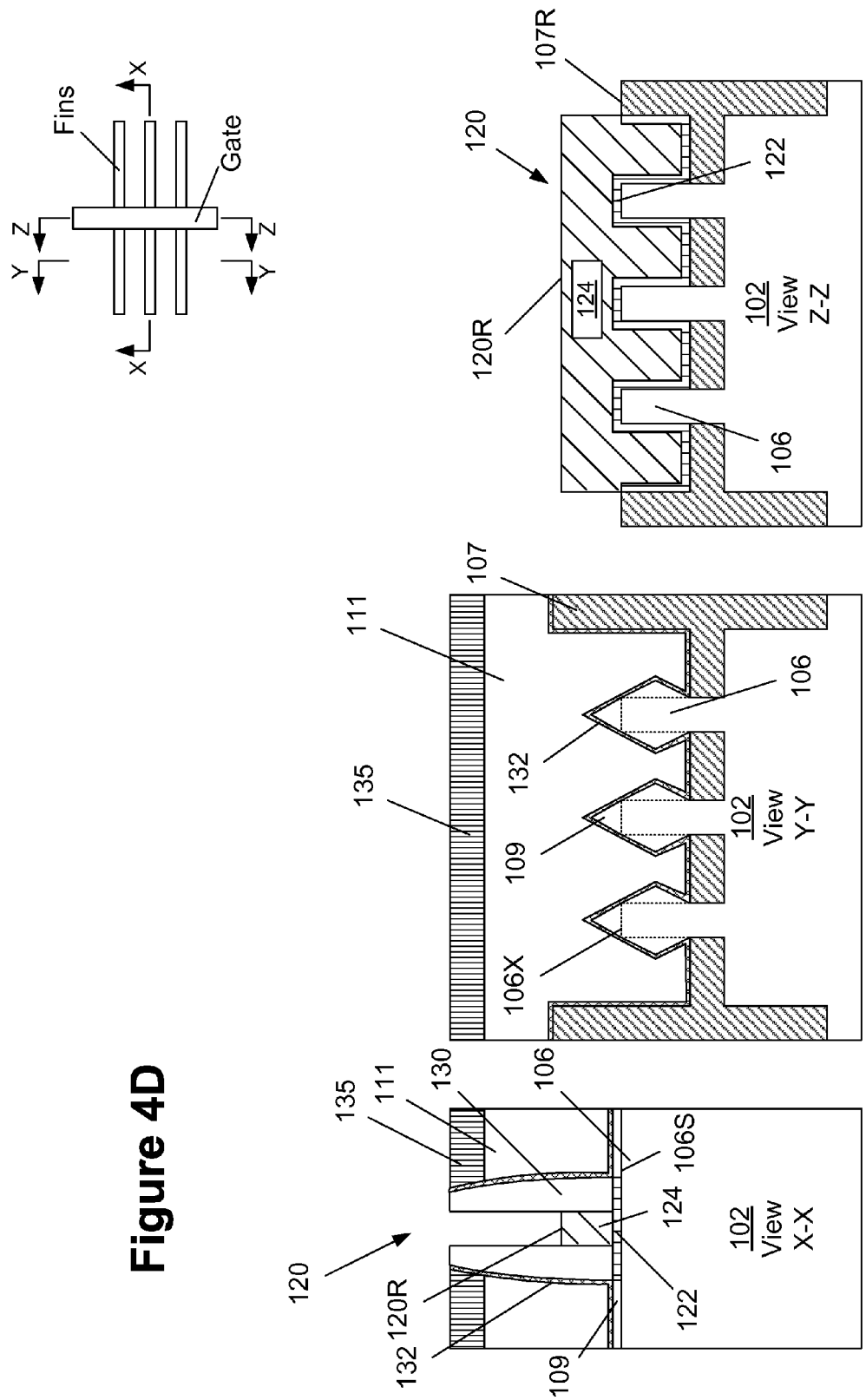

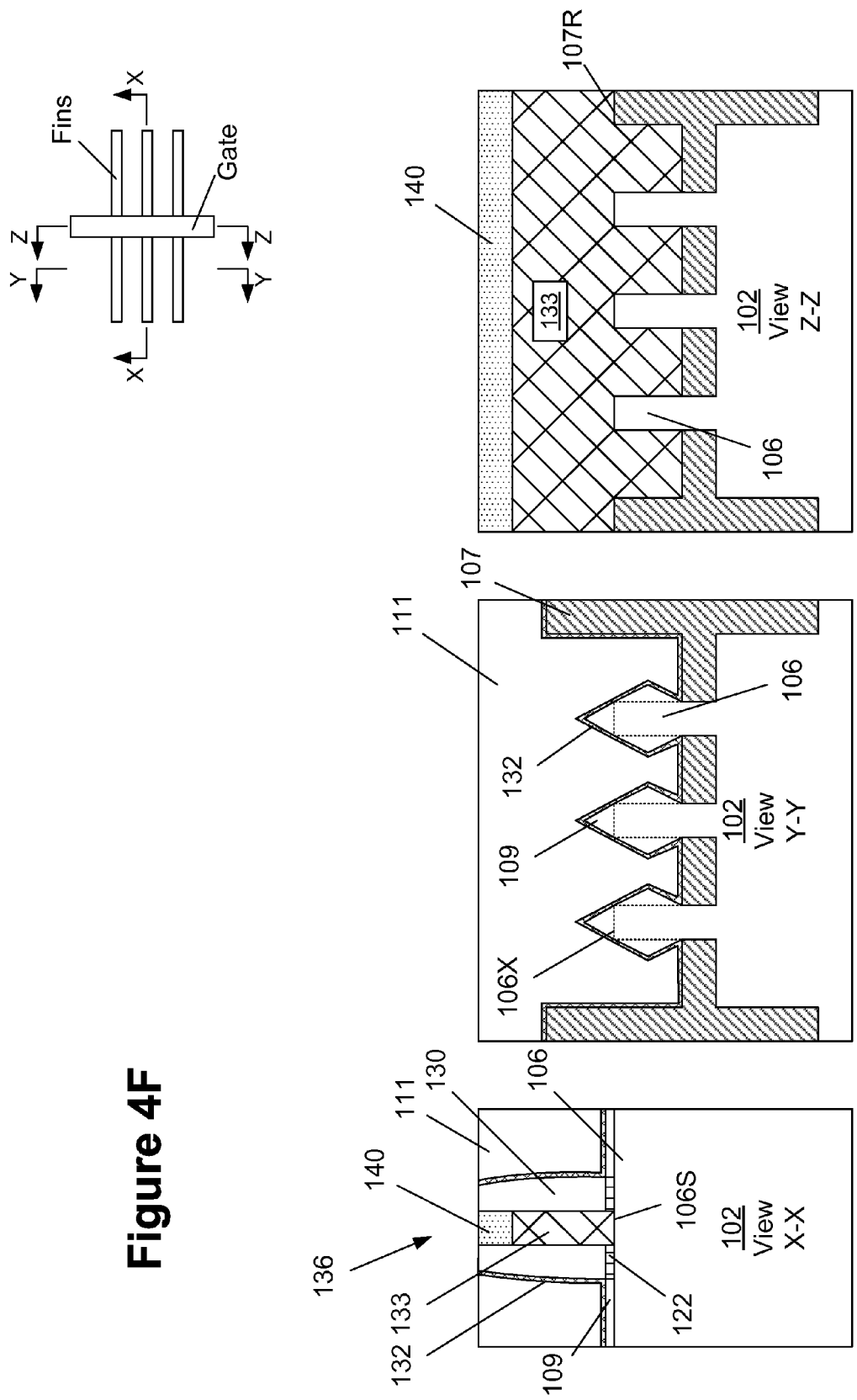

METHODS OF FORMING CONTACT STRUCTURES ON FINFET SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of forming contact structures for FinFET semiconductor devices and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source drain regions. Even if an epi "merger" process is not performed, an epi growth process will typically be performed on the fins C to increase their physical size.

In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG)

have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1E simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1D, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap layer positioned above the surface of the layer of insulating material 17. The gate cap layer 31 is formed so as to protect the underlying gate materials during subsequent processing operations.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with the density of circuit elements in the device level.

As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically, the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

FIG. 2 is a simplistic plan view of an illustrative prior art FinFET device 60 that will be referenced to discuss one particular problem as it relates to the formation of contact structures on a FinFET device. In general, the FinFET device 60 is formed above an active region 61 that is defined in a semiconductor substrate isolation structure (not shown), such as a shallow trench isolation structure. In the depicted example, the FinFET device 60 is comprised of three illustrative fins 62 and an illustrative gate structure 63. A sidewall spacer 63A and a gate cap layer 63B may be formed so as to encapsulate the gate structure 63. The fins 62 may be either merged or unmerged. In the depicted example, the fins 62 are unmerged. The fins 62 constitute the source/drain (S/D) regions of the device 60. Also depicted are illustrative source/drain contact structures 64 (which are sometimes referred to as "trench silicide" or "TS" or "CA" structures) and a gate contact structure 65 (which is sometimes referred to as a "CB" structure). The source/drain contact structures 64 are formed as a line-type structure to insure, to the extent possible, good contact is achieved with all of the exterior surfaces of all of the fins 62, even when assuming a "worst-case" misalignment scenario. The line-type source/drain contact structures 64 extend across the entire width 69 of the active region 61 in the gate-width direction 69 of the device 60. The space 66 between the gate contact structure 65 and the source/drain contact structures 64 must be large enough such that a short circuit cannot form between the gate contact structure 65 and one of the line-type source/drain contact structures 64. In current day devices, the distance 66 may be very small, and, accordingly, the distance 67 between the active region 61 and the gate contact structure 65 may be set to be about 30-60 nm. One way to insure that such a short circuit is not created would be to simply increase the distance 67, i.e., position the gate contact structure 65 farther away from the ends of the line-type source/drain contact structures 64. Unfortunately, given the drive to ever increase packing densities, such a solution would undesirably increase the "foot-print" of the device 60, thereby resulting in an undesirable area consumption penalty.

The present disclosure is directed to various methods of forming contact structures for FinFET semiconductor devices and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming contact structures for FinFET semiconductor devices and the resulting semiconductor devices. One method disclosed includes, among other things, performing at least one etching process so as to define at least one fin in a semiconductor substrate, forming a raised isolation structure with a recess above the substrate, wherein the recess has a bottom surface that is positioned below an upper surface of the raised isolation structure and an interior perimeter surface, and wherein the bottom surface of the recess exposes at least a portion of the fin, forming a gate structure above the fin, forming a plurality of spaced-apart buried fin contact structures within the recess, wherein the buried fin contact structures are formed in the recess on opposite sides of the gate structure, the buried fin contact structures are conductively coupled to the fin, and they have a substantially planar upper surface that is positioned level with or below the upper surface of the raised isolation structure, forming at least one layer of insulating material above the buried fin contact structures and the raised isolation structure, and forming a plurality of source/drain contact structures in the layer of insulating material, wherein each of the source/drain contact structures is conductively coupled to one of the plurality of buried fin contact structures.

Another illustrative method disclosed herein includes, among other things, performing at least one etching process so as to define at least one fin in the substrate, forming a raised isolation structure with a recess formed therein above the substrate, wherein the recess has a bottom surface that is positioned below an upper surface of the raised isolation structure and an interior perimeter surface, and wherein the bottom surface of the recess exposes at least a portion of the fin, forming a gate structure having an outer sidewall spacer positioned adjacent thereto above the fin, forming a plurality of spaced-apart buried fin contact structures within the recess, wherein the buried fin contact structures are formed in the recess on opposite sides of the gate structure, and wherein each of the buried fin contact structures is conductively coupled to the fin, and they have an upper surface that is positioned level with or below the upper surface of the raised isolation structure and an outer perimeter surface that contacts at least a portion of the interior perimeter surface of the recess and the outer sidewall spacer formed adjacent the gate structure, forming at least one layer of insulating material above the plurality of buried fin contact structures and the raised isolation structure, and forming a plurality of post-type source/drain contact structures in the layer of insulating material, wherein each of the source/drain contact structures is conductively coupled to one of the plurality of buried fin contact structures.

One illustrative device disclosed herein includes, among other things, at least one fin defined in a semiconductor substrate, a raised isolation structure with a recess formed therein, wherein the recess has a bottom surface that is positioned below an upper surface of the raised isolation structure and an interior perimeter surface, a gate structure positioned around at least a portion the fin, a plurality of spaced-apart buried fin contact structures positioned within the recess, wherein each of the buried fin contact structures is positioned on opposite sides of the gate structure and wherein each of the buried fin contact structures is conductively coupled to the fin and has an upper surface that is positioned level with or below the upper surface of the raised isolation structure. In this embodiment, the device further comprises at least one layer of insulating material positioned above the plurality of buried fin contact structures and the raised isolation structure and a plurality of source/drain contact structures positioned in the layer of insulating material, wherein each of the source/drain contact structures is conductively coupled to one of the plurality of buried fin contact structures.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of the transistors using a so-called "replacement gate" technique;

FIGS. 3A-3M depict one illustrative method disclosed for forming contact structures on FinFET semiconductor devices and the resulting semiconductor devices; and FIGS. 4A-4G depict another illustrative method disclosed for forming contact structures on FinFET semiconductor devices and the resulting semiconductor devices.

Figure 2:
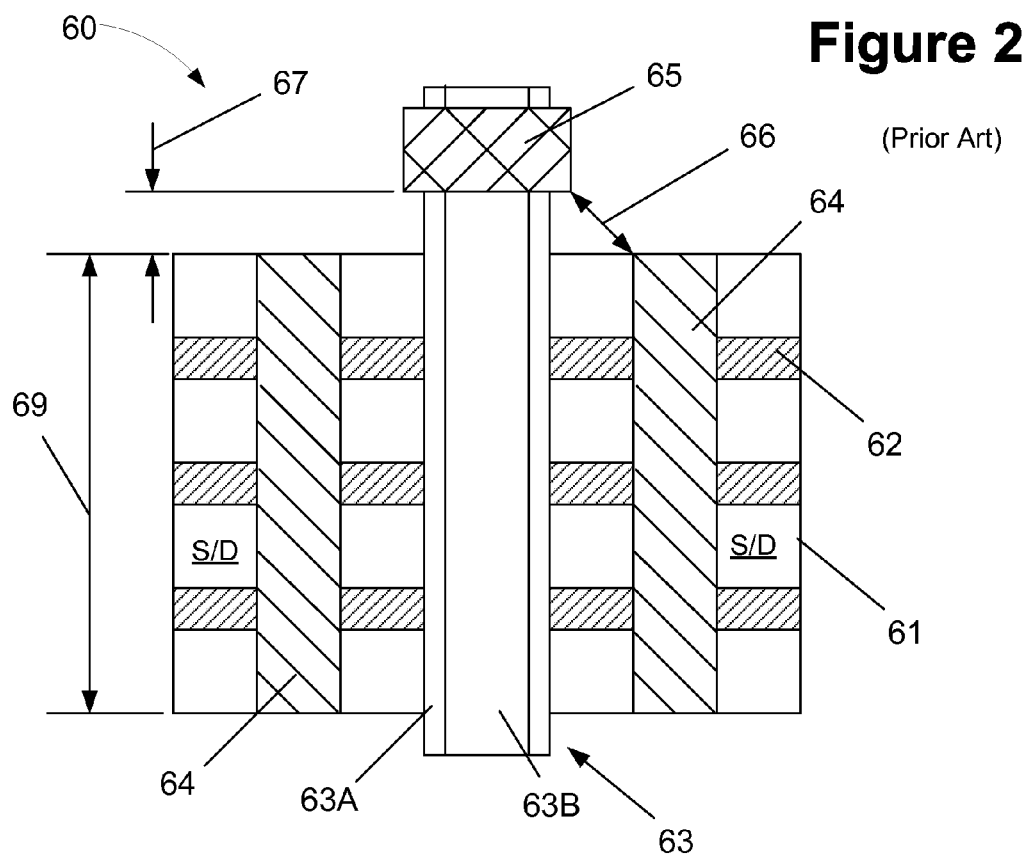
FIG. 2 is a simplistic plan view of one illustrative embodiment of a prior art FinFET device with various contact structures formed on the device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming contact structures for FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. However, the methods, structures and products disclosed herein may be employed where the gate structures of the transistors are formed using so-called "gate-first" processing techniques. Thus, the inventions disclosed herein should not be considered to be limited to the illustrative examples depicted and described herein. With reference to the attached figures, various illustrative embodiments of the methods and devices disclosed herein will now be described in more detail.

FIGS. 3A-3M depict one illustrative method disclosed for forming contact structures on FinFET semiconductor devices and the resulting semiconductor devices. The illustrative device 100 will be formed in and above the semiconductor substrate 102. The device 100 may be either an NMOS or a PMOS transistor. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIGS. 3A-3M present various cross-sectional views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is taken along the long axis of a fin (the current transport direction); the view "Y-Y" is a cross-sectional view that is taken through the source/drain region of the device in a direction that is transverse to the long axis of the fins; and the view "Z-Z" is a cross-sectional view taken through the gate structure of the device.

Figure 3A:
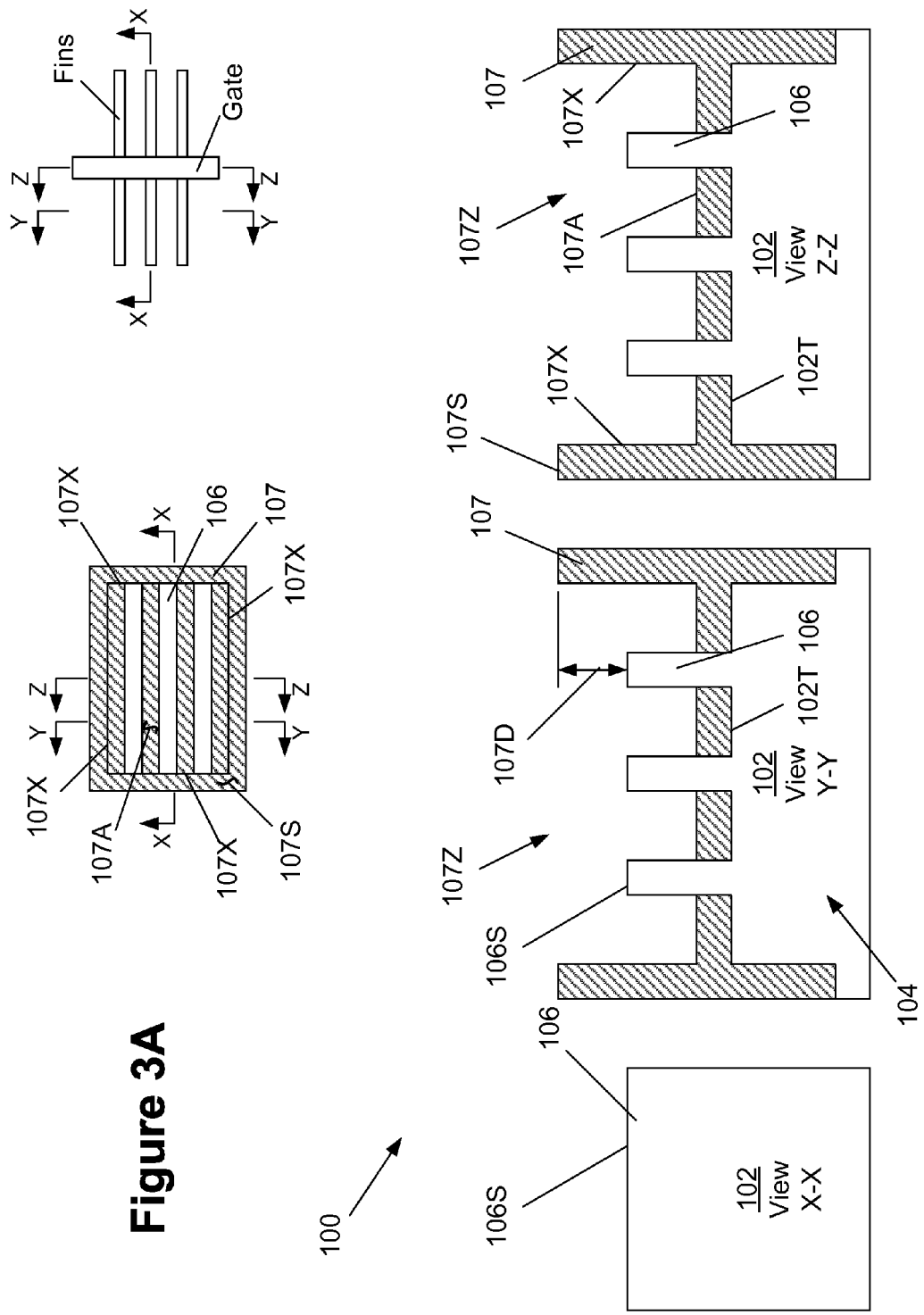

FIG. 3A depicts the device 100 at a point in fabrication wherein several process operations have been performed. FIG. 3A also contains a simplistic plan view of the device 100 showing the formation of the raised isolation region 107. First, a plurality of trenches 102T were formed in the substrate 102 to thereby define a plurality of fins 106 and deeper trenches where a raised isolation region 107 will be formed. The illustrative FinFET device 100 disclosed herein will be depicted as being comprised of three illustrative fins 106 with an upper surface 106S. However, as will be recognized by those skilled in the art after a complete reading of the present application, the methods and devices disclosed herein may be employed when manufacturing FinFET devices having any number of fins. In one embodiment, the trenches 102T were formed by performing one or more etching processes through one or more patterned etch masks (not shown), e.g., a patterned hard mask layer, using known etching techniques. The patterned etch masks may be patterned using known sidewall image transfer techniques and/or photolithographic techniques, combined with performing known etching techniques. In some applications, a further etching process may be performed to reduce the width or to "thin" the fins 106, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

The manner in which the illustrative raised isolation region 107 may be formed are well known to those skilled in the art. For example, in one embodiment, after the trenches are formed, a layer of insulating material (not separately shown), such as silicon dioxide, was blanket-deposited on the substrate 102 so as to over-fill the trenches 102T with the desired amount of material so as to provide the additional thickness or height of the raised isolation region 107. A CMP process may then be performed to planarize the upper surface 107S of the raised isolation region 107. Next, a patterned etch mask (not shown) is formed above the planarized layer of insulating material to expose a portion of the layer of insulating material where it is desired to reduce its thickness, i.e., in the area between the fins 106. Next, a timed, recess etching process was performed on the exposed portions of the layer of insulating material to reduce the thickness of the layer of insulating material, i.e., to form a recess 107Z in the raised isolation structure 107 having a recessed bottom surface 107A and an interior perimeter surface 107X. Effectively, this produces a thinner layer of the insulating material in the bottom of the trenches 102T so as to locally isolate the fins 106 from one another. This recess etching process exposes the fins 106 to their approximate desired final fin height. The overall height of the raised isolation region 107 may vary depending upon the particular application. In one illustrative embodiment, the raised isolation region 107 is formed such that its upper surface 107S is positioned approximately 30-50 nm above the level of the upper surface 106S of the fins 106, as reflected by the dimension 107D. Another illustrative process flow for form forming the raised isolation region 107 includes the following steps: (1) perform the etching process to define the fins 106; (2) over-fill the trenches 102T with silicon dioxide; (3) perform a CMP process on the layer of silicon dioxide that stops on the fins 106; (4) deposit an additional layer of silicon nitride above the polished layer of silicon dioxide; (5) perform an etching process to remove any unwanted fins and define STI trenches; (6) over-fill the STI trenches with silicon dioxide and perform a CMP process that stops on the layer of silicon nitride; (7) remove the exposed layer of silicon nitride; and (8) recess the layer of silicon dioxide to reveal the desired height of the fins 106.

With continuing reference to FIG. 3A, the overall size, shape and configuration of the trenches 102T and fins 106 may vary depending on the particular application. The depth and width of the trenches 102T may vary depending upon the particular application. In one illustrative embodiment, based on current day technology, the depth of the trenches 102T may range from approximately 40-100 nm and the width of the trenches 102T may be about 20-60 nm. In some embodiments, the fins 106 may have a final width (at or near the bottom of the fin) within the range of about 5-20 nm. In the illustrative examples depicted in the attached figures, the trenches 102T and fins 106 are all of a uniform size and shape. However, such uniformity in the size and shape of the trenches 102T and the fins 106 is not required to practice at least some aspects of the inventions disclosed herein. In the example depicted herein, the trenches 102T are formed by performing an anisotropic etching process that results in the trenches 102T having a schematically depicted, generally rectangular configuration. In an actual real-world device, the sidewalls of the trenches 102T may be somewhat inwardly tapered, although that configuration is not depicted in the drawings. In some cases, the trenches 102T may have a reentrant profile near the bottom of the trenches 102T. To the extent the trenches 102T are formed by performing a wet etching process, the trenches 102T may tend to have a more rounded configuration or non-linear configuration as compared to the generally rectangular configuration of the trenches 102T that are formed by performing an anisotropic etching process. Thus, the size and configuration of the trenches 102T and the fins 106, and the manner in which they are made, should not be considered a limitation of the present invention. For ease of disclosure, only the substantially rectangular trenches 102T and fins 106 will be depicted in subsequent drawings.

As will be appreciated by those skilled in the art after a complete reading of the present application, the inventions disclosed herein may be employed in forming integrated circuit products using either a "replacement gate" or a "gate-first" (by deleting the steps depicted in FIGS. 3D-3F below) technique. For purposes of disclosure, reference will be made to an illustrative process flow wherein the FinFET device 100 is formed using a replacement gate process flow. However, the inventions disclosed herein should not be considered to be limited to such an illustrative example.

Figure 3B:
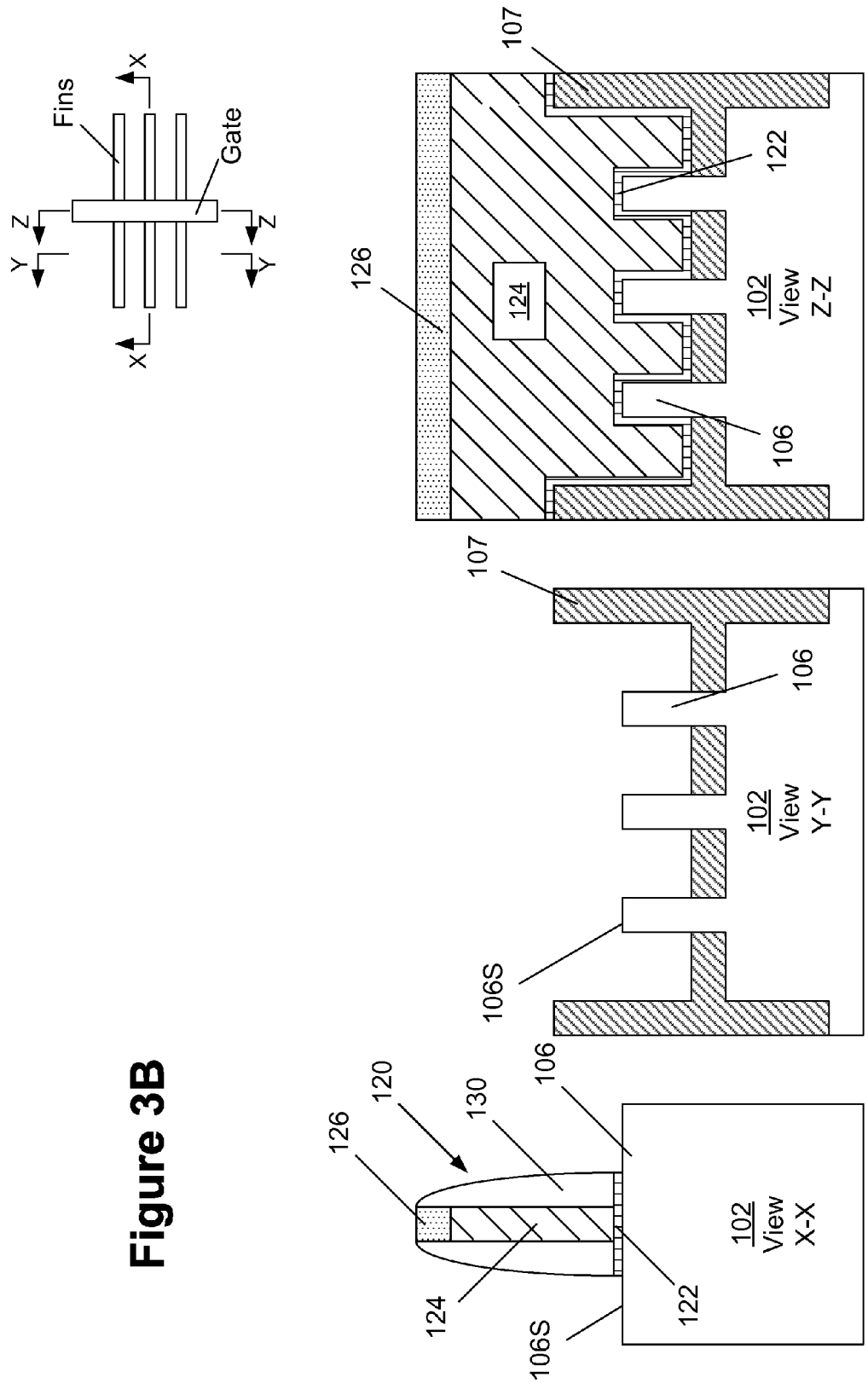

As noted above, in the example disclosed herein, the FinFET device 100 will be formed using a replacement gate technique. Accordingly, FIG. 3B depicts the device 100 at a point in fabrication wherein a sacrificial gate structure 120 has been formed above the substrate 102 and the fins 106. Also depicted is an illustrative gate cap layer 126 and sidewall spacers 130. The gate cap layer 126 and the sidewall spacers 130 are typically made of silicon nitride. The sacrificial gate structure 120 includes a sacrificial gate insulation layer 122 and a dummy or sacrificial gate electrode 124. The various components and structures of the device 100 may be formed using a variety of different materials and by performing a variety of known techniques. For example, the sacrificial gate insulation layer 122 may be comprised of silicon dioxide and the sacrificial gate electrode 124 may be comprised of polysilicon. The various layers of material depicted in FIG. 3B, as well as the layers of material described below, may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIG. 3C depicts the device 100 after several process operations were performed. First, an optional epi growth process was performed to form additional semiconductor material 109, e.g., silicon, on the exposed surfaces of the substrate 102. See views X-X and Y-Y. The generally diamond-shaped nature of the semiconductor material 109 (see view Y-Y) is due to the way the epi growth process proceeds and the orientation of the crystallographic planes in the substrate material. A dashed-line 106X reflects the outline of the original fin 106. The epi growth process is typically performed to increase the size of the material to which a conductive contact will later have to be formed. In some cases, if desired, a so-called fin-merger epi growth process is performed such that the epi material grown on one fin merges into the epi material grown on an adjacent fin. Such merged fins are not depicted in the drawings. Thereafter, a thin etch stop liner 132 (e.g. 2-3 nm) was formed above the entire device 100. The etch stop liner 132 may be comprised of a variety of materials, e.g., silicon nitride, hafnium oxide, etc., and it may be formed by performing a conformal ALD or CVD process. Typically, after the epi material 109 is formed, an anneal process is performed to activate the implanted dopant materials and repair any damage to the substrate 102 due to the various ion implantation processes that were performed.

FIG. 3D depicts the device 100 after several process operations were performed. First, a layer of insulating material 111 (e.g., silicon dioxide) was formed above the device 100 using traditional deposition techniques. Then, one or more planarization processes (e.g., CMP) were performed on the layer of insulating material 111 such that the upper surface 111S of the layer of insulating material 111 is substantially even with the upper surface 124S of the sacrificial gate electrode 124. Importantly, this planarization process exposes the upper surface 124S of the sacrificial gate electrode 124 such that it can be removed. In one illustrative embodiment, the planarization process may be a chemical mechanical planarization (CMP) process that stops on the sacrificial gate electrode 124.

FIG. 3E depicts the device 100 after one or more wet or dry etching processes were performed to remove the sacrificial gate electrode 124 and the sacrificial gate insulation layer 122 to thereby define a gate cavity 136 where a replacement gate structure will subsequently be formed for the device 100. Typically, the sacrificial gate insulation layer 122 is removed as part of the replacement gate technique, as depicted herein. However, the sacrificial gate insulation layer 122 may not be removed in all applications. Even in cases where the sacrificial gate insulation layer 122 is intentionally removed, there will typically be a very thin native oxide layer (not shown) that forms on the surface 106S of the fins within the gate cavity 136. To the extent that the removal of the sacrificial gate structure 120 causes any consumption of the isolation region 107, such consumption is not depicted in the attached drawings.

FIG. 3F depicts the device 100 after several process operations were performed. First, a pre-clean process was performed in an attempt to remove all foreign materials from within the gate cavity 136 prior to forming the various layers of material that will become part of the replacement gate structure 133. Thereafter, several known processing operations were performed to form a schematically depicted replacement gate structure 133 in the gate cavity 136. The replacement gate structure 133 depicted herein is intended to be representative in nature of any type of gate structure that may be employed in manufacturing integrated circuit products using so-called gate-last (replacement gate) manufacturing techniques. The replacement gate structure 133 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. Typically, the various layers of material present in the replacement gate structure 133 are sequentially deposited in the gate cavity 136 and above the layer of insulating material 111 and one or more CMP processes are performed to remove excess portions of the gate materials positioned outside of the gate cavity 136. Then, one or more etching processes were performed to remove upper portions of the various materials within the cavity 136 so as to form the replacement gate structure 133 and to form a recess above the replacement gate structure 133. Then, a gate cap layer 140 was formed in the recess above the recessed gate materials. The gate cap layer 140 is typically comprised of silicon nitride and it may be formed by depositing a layer of gate cap material so as to over-fill the recess formed in the gate cavity 136 above the replacement gate structure 133 and thereafter performing a CMP process to remove excess portions of the gate cap material positioned above the surface of the layer of insulating material 111. The gate cap layer 140 is formed so as to protect the underlying gate materials during subsequent processing operations.

FIG. 3G depicts the device 100 after several process operations were performed. First, an etching process was performed to remove the layer of insulating material 111. Thereafter, an etching process was performed to remove the etch stop layer 132. In some embodiments, the removal of the layer of insulating material 111 and the etch stop layer 132 may be accomplished is a single process chamber and changing the etch chemistries as needed. Then, a traditional silicidation process was performed to form metal silicide regions 110 on the surfaces of the epi semiconductor material 109 (see views X-X and Y-Y). In general, such a silicidation process typically involves depositing a layer of metal (not shown), such as nickel, cobalt, titanium, platinum, etc., or a combination of such materials, such that it contacts the exposed portions of the epi semiconductor material 109 (or on the fins 106 if no epi material 109 is grown). Then, a first anneal process is performed at a temperature that falls within the range of about 220-300° C. such that the layer of metal reacts with the silicon in the silicon-containing regions contacted by the layer of metal to thereby form a relatively higher resistance form of metal silicide. Next, portions of the layer of metal that did not react with the epi semiconductor material 109 during the first anneal process are removed by performing a standard stripping process. After the removal of the unreacted portions of the layer of metal, a second anneal process is performed on the device 100 at a temperature that falls within the range of about 400-500° C. so as to convert the relatively higher resistance silicide region into the relatively lower resistance metal silicide region 110. By forming the metal silicide regions 110 after the replacement gate structure 133 was formed (see FIG. 3F), the metal silicide region 110 is not exposed to the relatively high processing temperatures that may be associated with that activity. That is, a metal silicide material usually becomes unstable and its resistance increases if it is exposed to anneal temperatures greater than about 700° C.

FIG. 3H depicts the device 100 after a layer of conductive material 150, e.g., a metal, was blanket-deposited on the device 100. The layer of conductive material 150 will be the material from which a buried fin-contact structure will be formed, as described more fully below. In one illustrative embodiment, the layer of conductive material 150 may be comprised of tungsten, aluminum, copper, etc., and it may be formed by performing a PVD or a CVD process. Additionally, prior to the formation of the layer of conductive material 150, one or more barrier layers (not depicted) may be deposited on the product. In one illustrative example, the methods disclosed herein may include depositing a liner, e.g., Ti, TiN, followed by blanket-depositing a conductive material, such as tungsten. Thereafter, a CMP process may be performed to planarize the upper surface of the layer of conductive material 150.

Figure 3I:
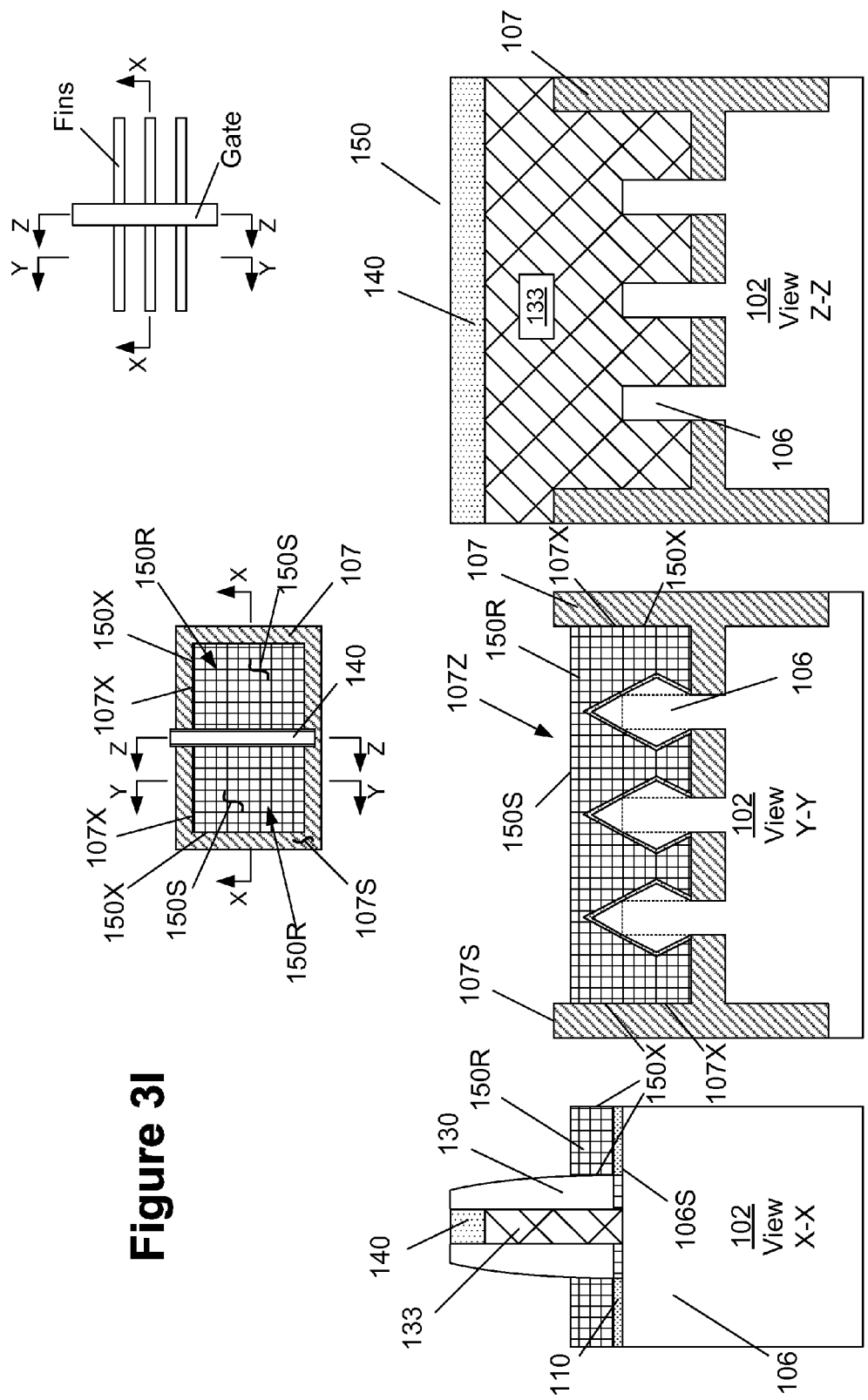

Next, as shown in FIG. 3I, a timed, recess etching process was performed on the layer of conductive material 150 to reduce its thickness such that its upper surface 150S is positioned approximately level with or about 3-5 nm below (i.e., below the level of) the upper surface 107S of the raised isolation region 107. This process operation results in the formation of a buried fin-contact structure 150R that is positioned in the recess 107Z formed in the raised isolation structure 107. Note that the buried fin-contact structure 150R is fully recessed relative to the upper surface 107S of the raised isolation region 107. FIG. 3I also contains a simplistic plan view of the device 100 showing the formation of the buried fin-contact structures 150R within the recess 107Z of the raised isolation region 107 on opposite sides of the gate structure. Also note that the exterior perimeter surfaces 150X engage the interior perimeter surfaces 107X of the recess 107Z, and, in the depicted example, engage the outer sidewall spacers 130.

Figure 3J:
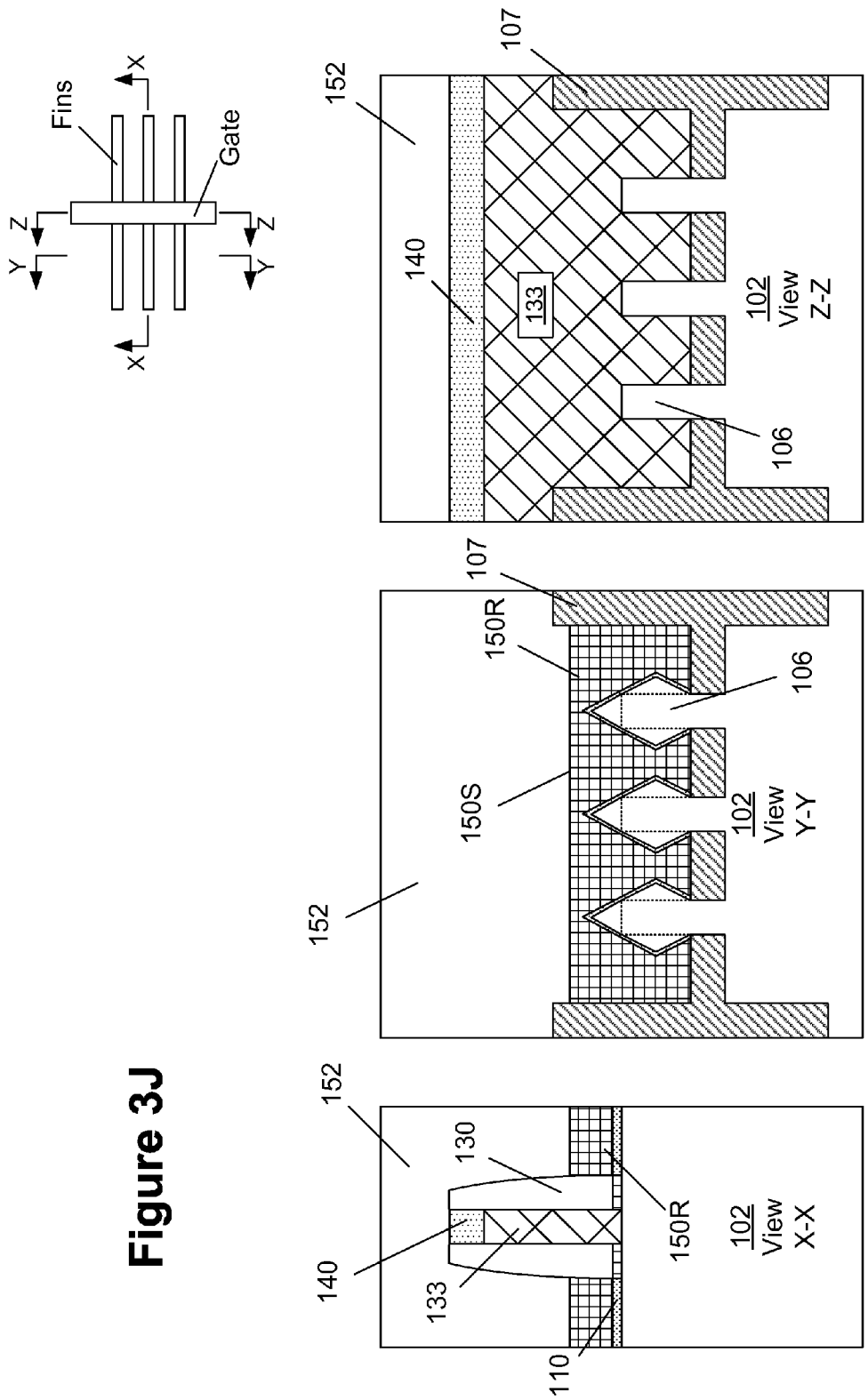

FIG. 3J depicts the device 100 after a layer of insulating material 152 (e.g., silicon dioxide) was formed above the device 100 using traditional deposition techniques. Then, one or more planarization processes (e.g., CMP) were performed on the layer of insulating material 152. The layer of insulating material 152 along with the raised isolation region 107 effectively encapsulates the buried fin-contact structure 150R.

Figure 3K:
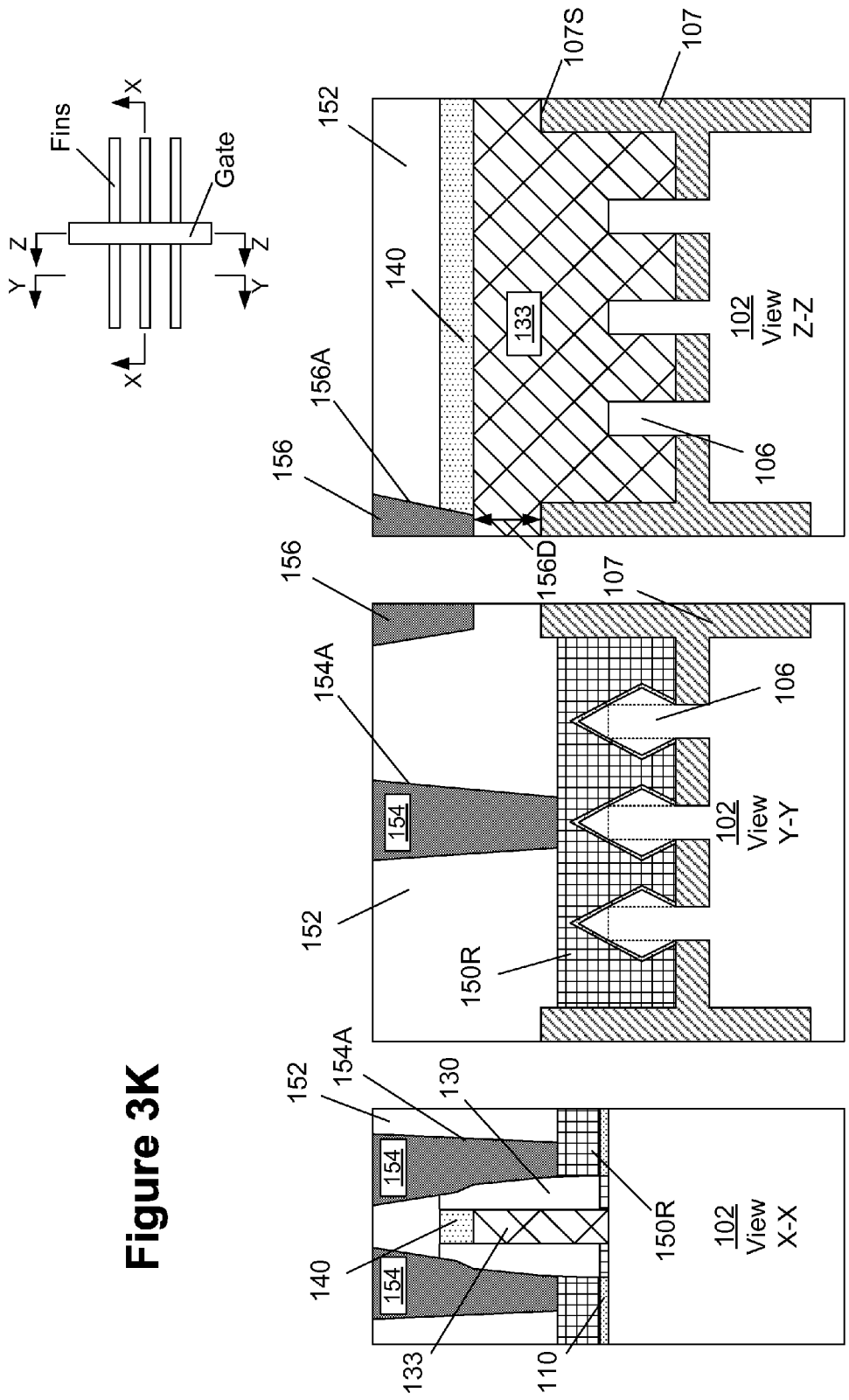

FIG. 3K depicts the device 100 after several process operations were performed to form a conductive source/drain contact structure 154 to each of the buried fin-contact structures 150R and to form the gate contact structure 156 that is conductively coupled to the replacement gate structure 133, i.e., to the conductive gate materials that are part of the replacement gate structure 133. Typically, this processing sequence involves performing one or more etching processes through one or more etch mask layers (not shown) on the exposed portions of the layer of insulating material 152 and/or on the gate cap layer 140 to define contact openings 154A/156A for the various conductive structures. The source/drain contact structures 154 and the gate contact structure 156 may be of any desired cross-sectional configuration when viewed from above, e.g., square, rectangular, round, etc. As depicted, the source/drain contact structures 154 are conductively coupled to the buried fin-contact structures 150R while the gate contact structure 156 is conductively coupled to the replacement gate structure 133. The source/drain contact structures 154 and the gate contact structure 156 are intended to be schematic and representative in nature, as they may be formed using any of a variety of different conductive materials and by performing traditional manufacturing operations. The contact structures 154/156 may also contain one or more barrier layers (not depicted). In one illustrative example, the contact structures 154/156 may be formed by depositing a liner, e.g., Ti, TiN, followed by overfilling the contact openings 154A/156A with a conductive material, such as tungsten. Thereafter, a CMP process may be performed to planarize the upper surface of the layer of insulating material 152, which results in the removal of excess portions of the liner and the tungsten positioned above the layer of insulating material 152 outside of the openings 154A/154B and the formation of the contact structures 154/156. Note that, in one embodiment, the thickness 156D of the replacement gate structure 133 above the raised isolation region 107 where the gate contact structure 156 will make contact may be on the order of about 20 nm.

Figure 3L:
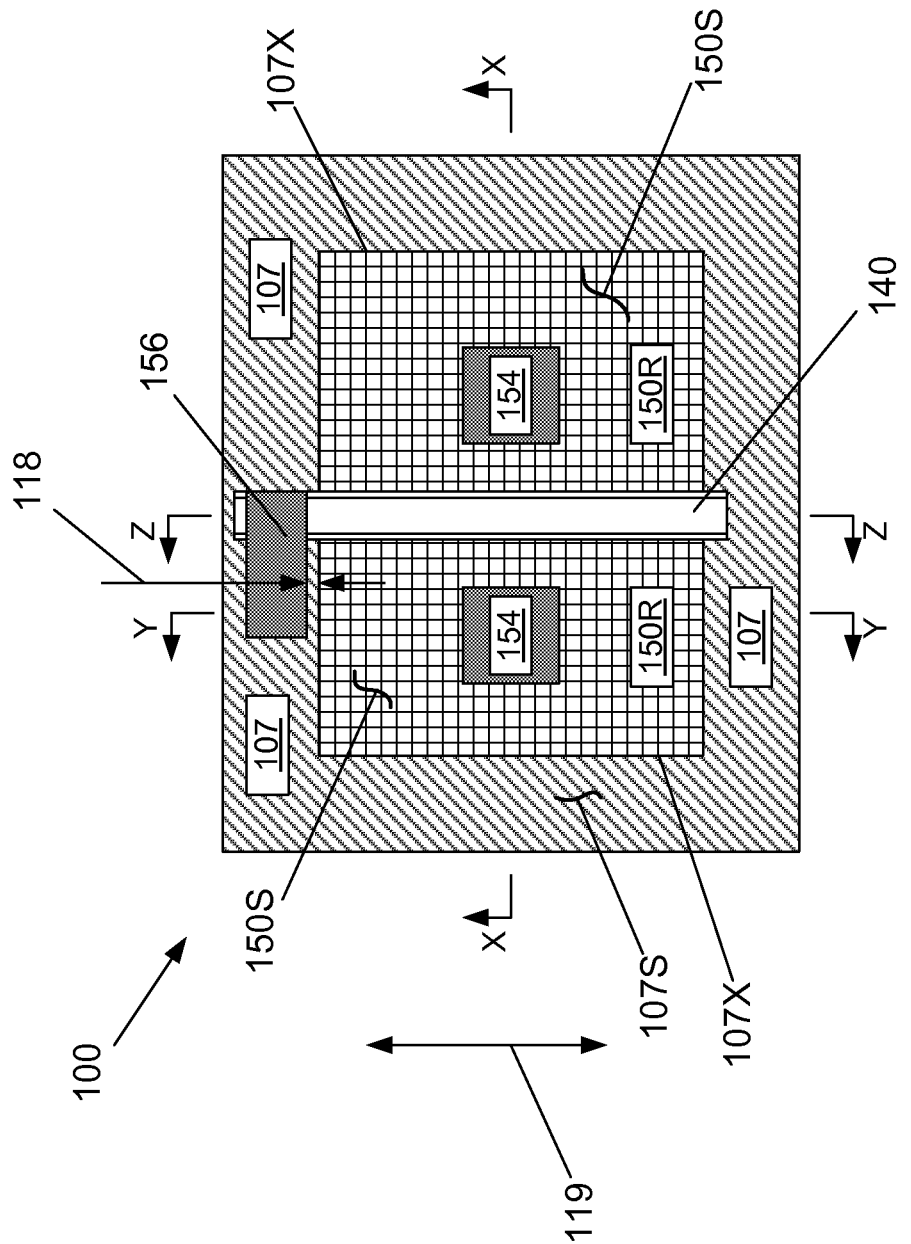
Figure 3M:
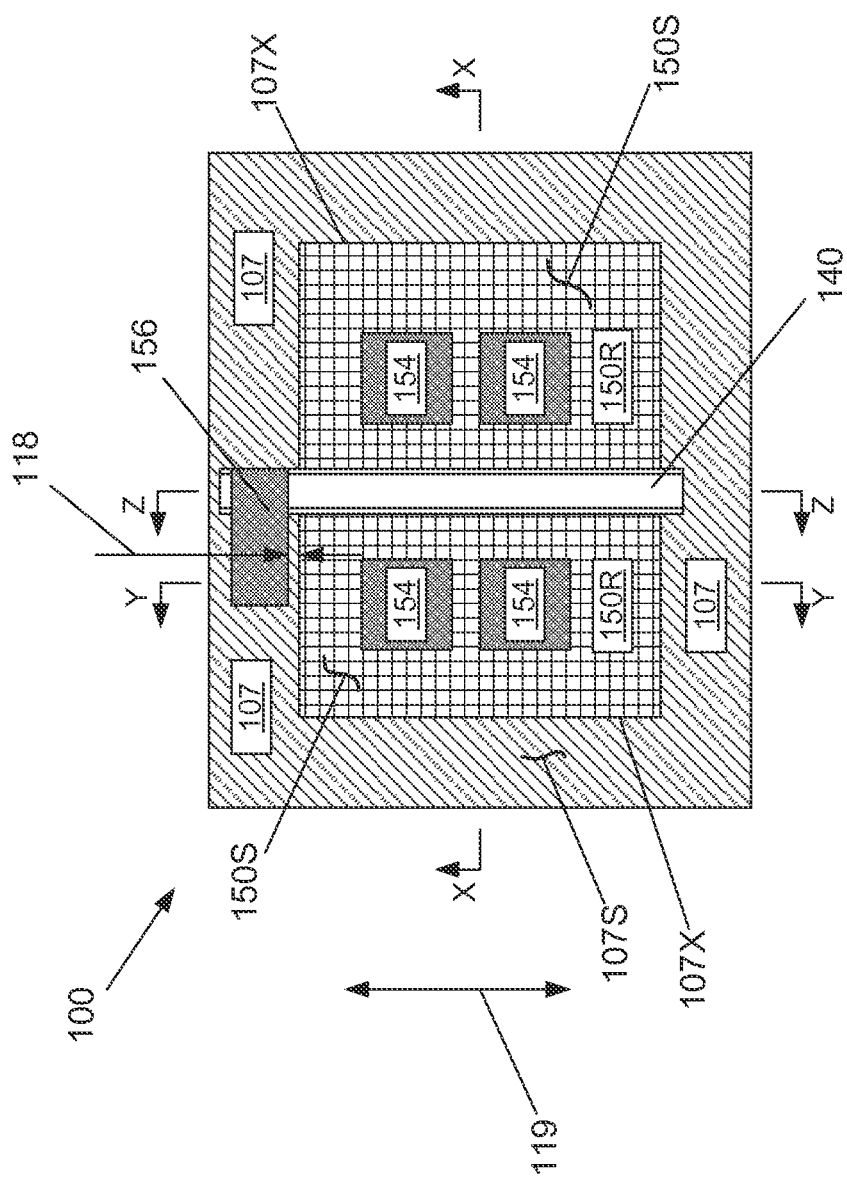

FIG. 3L is a simplistic plan view of one embodiment of a FinFET device 100 disclosed herein after the formation of the illustrative contact structures 154/156 with the layer of insulating material 152 removed. As can be seen, the buried fin-contact structure 150R is positioned within the recess 107X of the raised isolation region 107. Note that, due to the fact that the buried fin-contact structure 150R is conductively coupled to all of the fins 106, the source/drain contact structure 154 may be a single post-type source/drain contact structure as compared to the typical prior art line-type source/drain contact structures 64 shown in FIG. 2. Accordingly, the distance between the source/drain contact structure 154 and the gate contact structure 156 may be increased relative to that distance in prior art devices and, correspondingly, the chances of the gate contact structure 156 shorting with the source/drain contact structures 154 is reduced. The structure of the device 100 herein also means that the distance 118 between the active area and the gate contact structure 156 may be reduced as compared to prior art structures. For example, in one illustrative embodiment, the distance 118 between the active region and the gate contact structure 156 may be about 10-30 nm. Accordingly, using the methods and devices disclosed herein, the packing densities on integrated circuit products using such devices 100 may be reduced relative to corresponding prior art products, thereby desirably decreasing the "foot-print" of the device 100. In particular, note that in the devices disclosed herein, the post-type source/drain contact structures 154 do not extend across the entire width of the active region in the gate-width direction 119 of the device 100. Rather, the ends of the post-type source/drain contact structures 154 stop well short of the edges of the active region. In one embodiment, the dimension (length or diameter) of the post-type source/drain contact structures 154 in the gate width direction 119 may be about 10-80% of the overall width of the active region in the gate width direction 119 of the device 100. In the depicted example, a single post-type source/drain contact structures 154 is depicted as being formed to establish electrical contact to the source/drain regions. However, if desired, more than one of the post-type source/drain contact structures 154 may be formed on each of the source/drain regions. For example, two of the post-type source/drain contact structures 154 may be formed so as to contact the buried fin-contact structure 150R above each of the source/drain regions of the device, as illustrated in FIG. 3M. Additionally, it is worth noting that the above-described structure was achieved without having to form any additional masks than those used in current processing techniques.

Figure 4B:
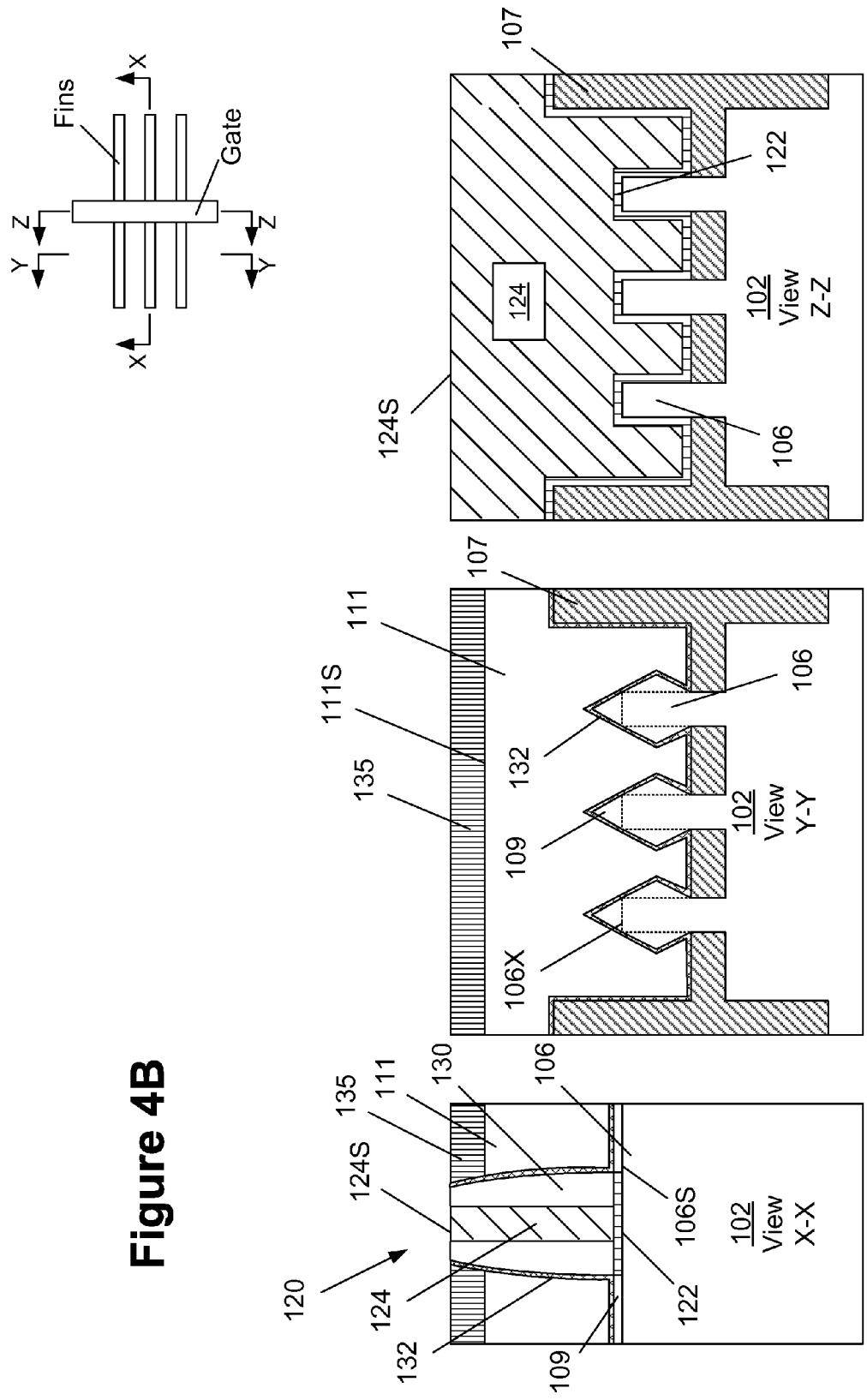

FIGS. 4A-4G depict another illustrative method disclosed for forming contact structures on FinFET semiconductor devices and the resulting semiconductor devices. FIG. 4A depicts the device 100 at a point in fabrication that corresponds to that shown in FIG. 3C above, i.e., the sacrificial gate structure 120, the epi semiconductor material 109 and the etch stop layer 132 have been formed as described above.

FIG. 4B depicts the device 100 after several process operations were performed. First, the above-described insulating material 111 (e.g., silicon dioxide) was formed above the device 100 using traditional deposition techniques. Then, one or more planarization processes (e.g., CMP) were performed on the layer of insulating material 111 such that its upper surface was substantially planar. Next, an etch-back process was performed to recess the upper surface 111S of the layer of insulating material 111 a desired amount relative to the upper surface 124S of the sacrificial gate structure 124, e.g., a distance of about 10-20 nm. Then, a sacrificial material layer 135, e.g., silicon nitride, (with a final thickness after CMP of about 5-15 nm) was blanket-deposited on the device 100. One or more CMP processes were then performed so as to remove all materials positioned above the upper surface 124S of the sacrificial gate electrode 124. Importantly, these operations result in the exposure of the sacrificial gate electrode 124 so that it can be removed. In some cases, the sacrificial silicon nitride material 135 may not need to be formed as indicated. Additional silicon dioxide material could have been formed in lieu of the sacrificial silicon nitride material 135, as the purpose of the sacrificial silicon nitride material 135 is to prevent excessive loss of the silicon dioxide material during subsequent processing operations. If desired, the layers of material may be formed as described in U.S. patent application Ser. No. 13/654,717 entitled "Facilitating Gate Height Uniformity and Inter-layer Dielectric Protection," which is hereby incorporated by reference in its entirety.

Figure 4C:
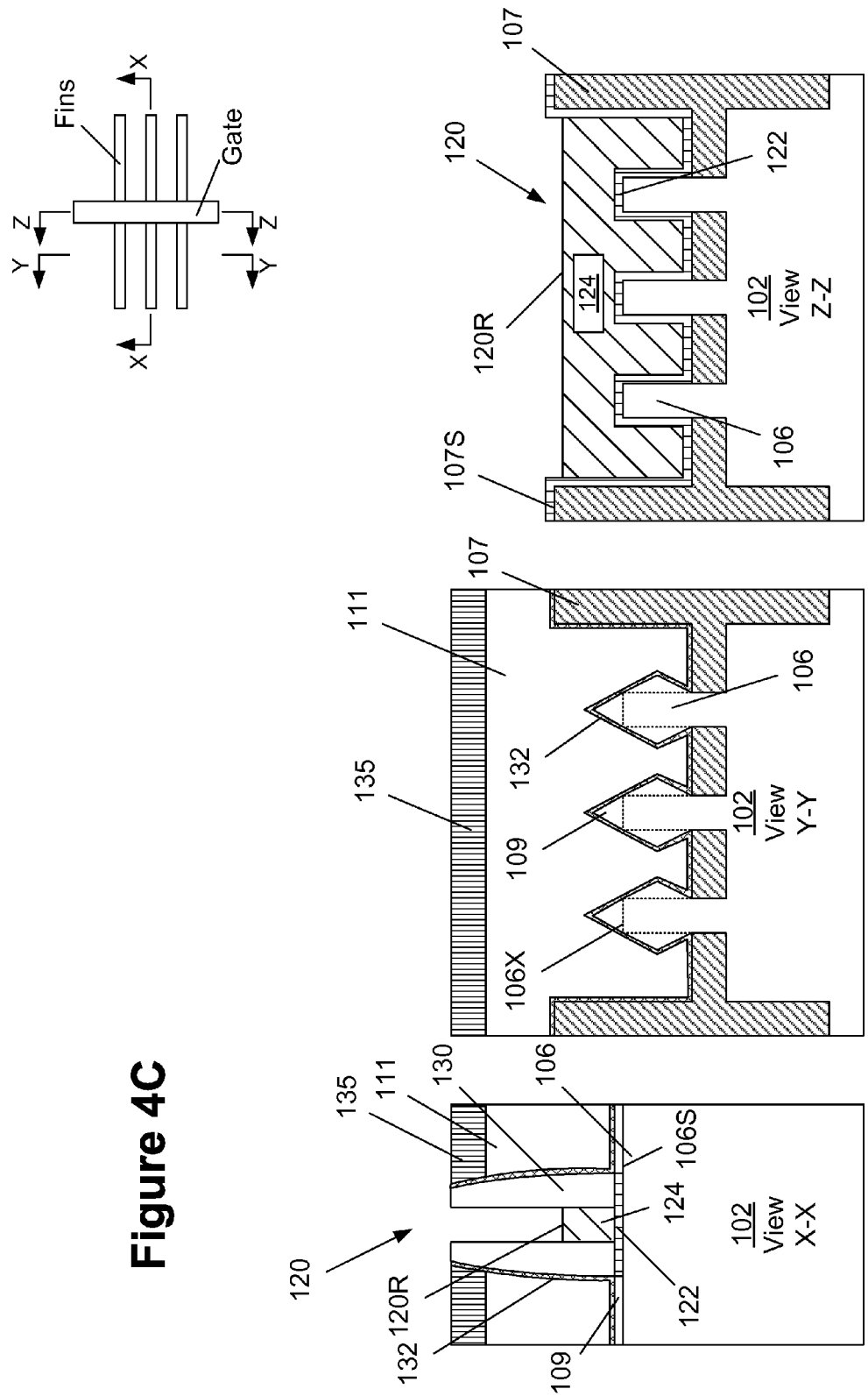

FIG. 4C depicts the device 100 after one or more wet or dry etching processes were performed to remove a portion, but not all, of the sacrificial gate structure 120, such that the now-recessed upper surface 120R of the recessed sacrificial gate structure is positioned at a level that is approximately even with the upper surface 107S or below (i.e., at a level below) the upper surface 107S of the raised isolation region 107 by a distance of about 3-20 nm. This etching process results in the definition of a partial gate cavity, as not all of the sacrificial gate structure has been removed.

FIG. 4D depicts the device 100 after a timed etching process was performed to remove the exposed portions of the sacrificial gate insulation layer 122 and to recess portions of the raised isolation region 107 that will underlie the replacement gate structure. Note the recessed surface 107R of the raised isolation region 107 in view Z-Z. In one embodiment, the now-recessed surface 107R of the raised isolation region 107 is positioned below the upper surface 120R of the recessed sacrificial gate structure by a distance of about 10-50 nm.

Figure 4E:
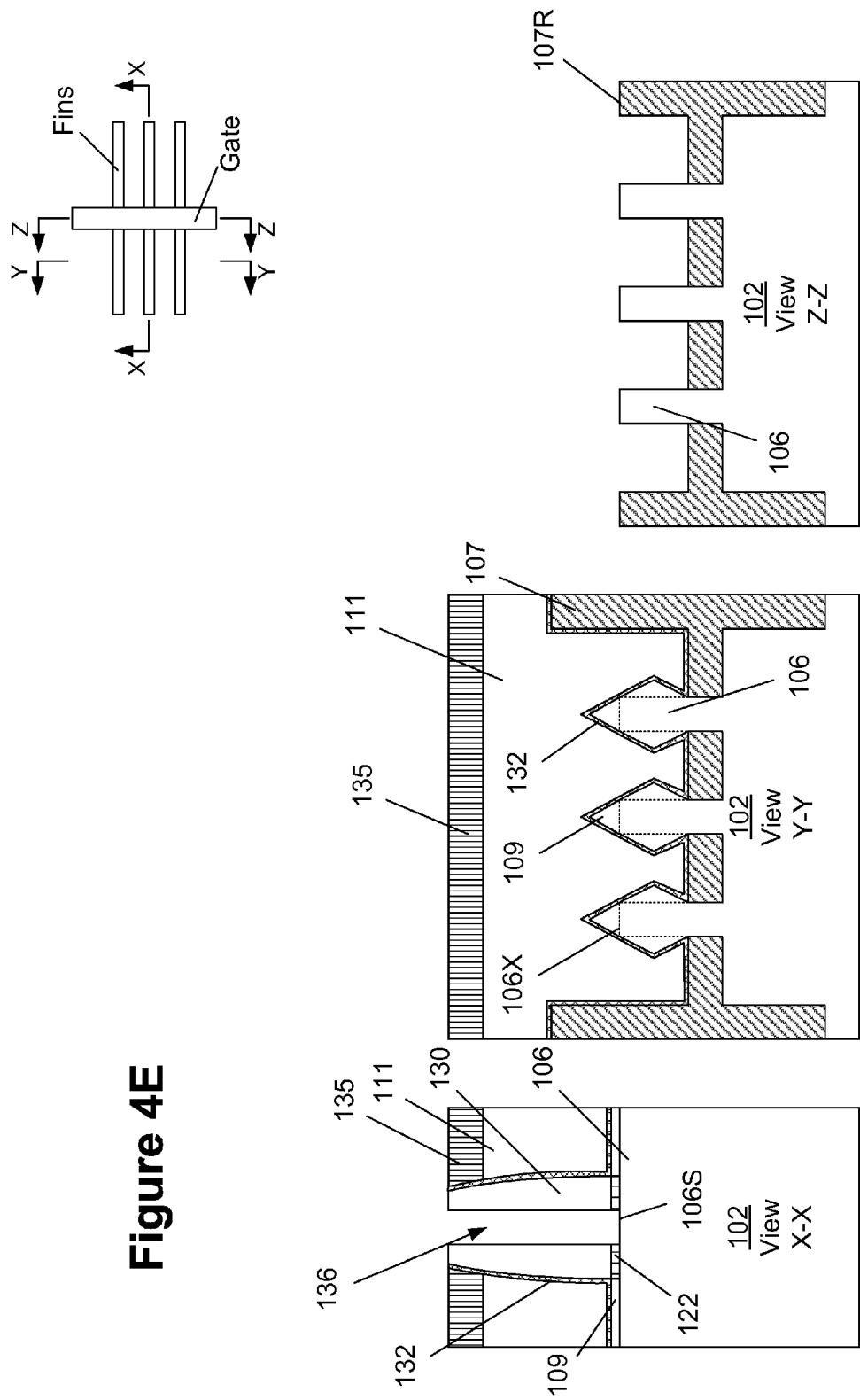

FIG. 4E depicts the device 100 after one or more wet or dry etching processes were performed to remove the remaining portions of the recessed sacrificial gate structure, i.e., any remaining portion of the sacrificial gate electrode 124 and the sacrificial gate insulation layer 122, to thereby define the full gate cavity 136 where the replacement gate structure will subsequently be formed for the device 100.

FIG. 4F depicts the device 100 after several process operations were performed. First, the materials for the above-described replacement gate structure 133 were formed in the gate cavity 136. As part of that process, and as described above, one or more etching processes were performed to remove the upper portions of the various materials within the cavity 136 so as to form the replacement gate structure 133 and to form a recess above the replacement gate structure 133. Then, the gate cap layer 140 was formed in the recess above the recessed gate materials. During the CMP processes performed in forming the gate cap layer 140, the sacrificial material layer 135 was cleared from above the surface of the layer of insulating material 111 (see view Y-Y).

Figure 4G:
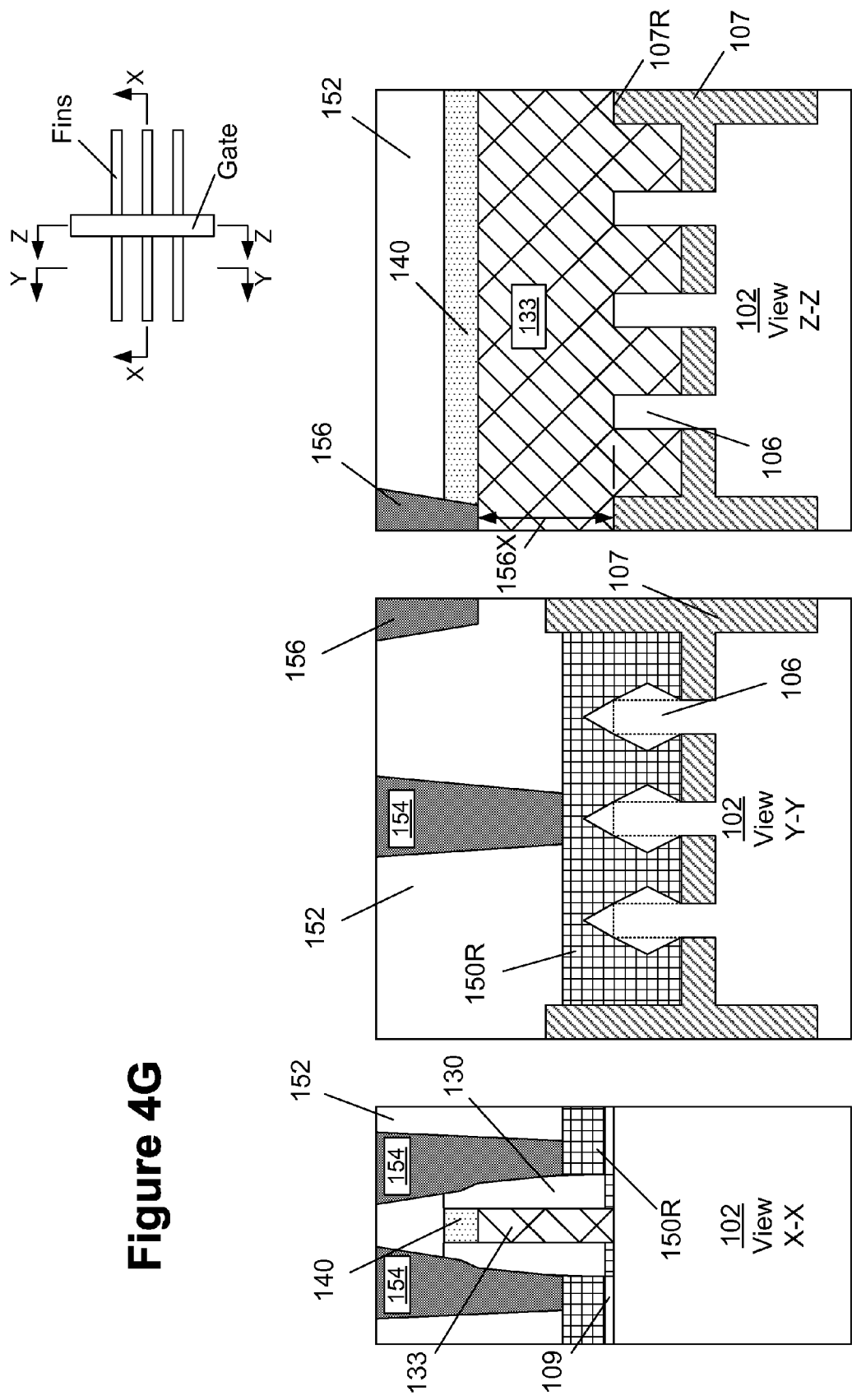

FIG. 4G depicts the device 100 after the above-described buried fin-contact structure 150R, layer of insulating material 152, source/drain contact structures 154 and the gate contact structure 156 have been formed. Note that, due to the recessing of the raised isolation region 107, the thickness of the replacement gate structure 133 where contact is made by the gate contact structure 156 is greater than that for the device shown in FIG. 3K (compare the distance 156D with the distance 156X). In one embodiment, the thickness 156X of the replacement gate structure 133 above the recessed surface 107R of the raised isolation region 107 where the gate contact structure 156 will make contact may be on the order of about 40 nm or more.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET transistor above a semiconductor substrate, said transistor comprising at least one fin, wherein the method comprises:
    performing at least one etching process so as to define said at least one fin in said substrate;
    forming a raised isolation structure with a recess formed therein above said substrate, wherein said recess has a bottom surface that is positioned below an upper surface of said raised isolation structure and an interior perimeter surface, and wherein said bottom surface of said recess exposes at least a portion of a sidewall of said at least one fin;
    forming a gate structure above said at least one fin, wherein said upper surface of said raised isolation structure is positioned at a height below an upper surface of said gate structure;
    at least partially filling said recess with a conductive material to form a plurality of spaced-apart buried fin contact structures within said recess, wherein said conductive material completely covers said bottom surface and has a height above an upper surface of said at least on fin, said buried fin contact structures are formed in said recess on opposite sides of said gate structure, and each of said buried fin contact structures is conductively coupled to said at least one fin and has a substantially planar upper surface that is positioned level with or below said upper surface of said raised isolation structure;
    forming at least one layer of insulating material above said plurality of buried fin contact structures and said raised isolation structure; and
    forming a plurality of source/drain contact structures in said at least one layer of insulating material, wherein each of said source/drain contact structures is conductively coupled to one of said plurality of buried fin contact structures.

2. The method of claim 1, wherein said buried fin contact structures further comprise an outer perimeter surface, and wherein said plurality of buried fin contact structures are formed such that the outer perimeter surface of each of said buried fin contact structures contacts at least a portion of said interior perimeter surface of said recess in said raised isolation structure.

3. The method of claim 2, wherein each of said buried fin contact structures is formed such that said outer perimeter surface of said buried fin contact structures contacts said interior perimeter surface of said recess and a sidewall spacer formed adjacent said gate structure.

4. The method of claim 1, wherein forming said gate structure above said at least one fin comprises performing one of a gate-last or a gate-first processing sequence to form said gate structure.

5. The method of claim 1, wherein forming said plurality of source/drain contact structures comprises forming a plurality of post-type source/drain contact structures.

6. The method of claim 1, wherein forming said plurality of source/drain contact structures comprises forming at least four post-type source/drain contact structures, wherein two of said at least four post-type contact structures are conductively coupled to one of said buried fin contact structures.

7. The method of claim 1, wherein at least partially filling said recess with said conductive material comprises:
    depositing a layer of said conductive material above said raised isolation structure so as to over-fill said recess; and
    performing a timed recess etching process on said layer of conductive material so as to clear said conductive material from above said upper surface of said raised isolation structure and to define said buried fin contact structures having said upper surface that is positioned below said upper surface of said raised isolation structure.

8. The method of claim 1, wherein said gate structure is a sacrificial gate structure and wherein, prior to forming said plurality of spaced-apart buried fin contact structures, the method further comprises:
    performing at least one second etching process to remove a portion of at least a sacrificial gate electrode of said sacrificial gate structure so as to thereby define a recessed sacrificial gate structure and to define a partial gate cavity, wherein said at least one second etching process is performed such that an upper surface of said recessed sacrificial gate structure is positioned at a level below a level of said upper surface of said raised isolation structure;
    with said recessed sacrificial gate structure in position, performing at least one third etching process to reduce a thickness of a portion of said raised isolation structure in an area under said partial gate cavity such that an upper surface of said reduced thickness portion of said raised isolation structure is positioned at a level that is below said upper surface of said recessed sacrificial gate electrode;
    after performing said at least one third etching process, removing at least said recessed sacrificial gate structure so as to define a full gate cavity; and
    forming a replacement gate structure in said full gate cavity.

9. A method of forming a FinFET transistor above a semiconductor substrate, said transistor comprising at least one fin, wherein the method comprises:
    performing at least one etching process so as to define said at least one fin in said substrate;
    forming a raised isolation structure with a recess formed therein above said substrate, wherein said recess has a bottom surface that is positioned below an upper surface of said raised isolation structure and an interior perimeter surface, and wherein said bottom surface of said recess exposes at least a portion of a sidewall of said at least one fin;
    forming a gate structure having an outer sidewall spacer positioned adjacent thereto above said at least one fin, wherein said upper surface of said raised isolation structure is positioned at a height below an upper surface of said gate structure;
    at least partially filling said recess with a conductive material to form a plurality of spaced-apart buried fin contact structures within said recess, wherein said conductive material completely covers said bottom surface and has a height above an upper surface of said at least on fin, said buried fin contact structures are formed in said recess on opposite sides of said gate structure, each of said buried fin contact structures is conductively coupled to said at least one fin and has an upper surface that is positioned level with or below said upper surface of said raised isolation structure and an outer perimeter surface, and at least a portion of said outer perimeter surface of each of said buried fin contact structures contacts at least a portion of said interior perimeter surface of said recess in said raised isolation structure and said outer sidewall spacer formed adjacent said gate structure;

forming at least one layer of insulating material above said plurality of buried fin contact structures and said raised isolation structure; and forming a plurality of post-type source/drain contact structures in said at least one layer of insulating material, wherein each of said source/drain contact structures is conductively coupled to one of said plurality of buried fin contact structures.

10. The method of claim 9, wherein forming said plurality of source/drain contact structures comprises forming at least four post-type source/drain contact structures, wherein two of said at least four post-type source/drain contact structures are conductively coupled to one of said buried fin contact structures.

11. The method of claim 9, wherein at least partially filling said recess with said conductive material comprises:
depositing a layer of said conductive material above said raised isolation structure so as to over-fill said recess; and
performing a timed recess etching process on said layer of conductive material so as to clear said conductive material from above said upper surface of said raised isolation structure and to define said buried fin contact structures having said upper surface that is positioned below said upper surface of said raised isolation structure.

12. The method of claim 9, wherein said gate structure is a sacrificial gate structure and wherein, prior to forming said plurality of spaced-apart buried fin contact structures, the method further comprises:
performing at least one second etching process to remove a portion of at least a sacrificial gate electrode of said sacrificial gate structure so as to thereby define a recessed sacrificial gate structure and to define a partial gate cavity, wherein said at least one second etching process is performed such that an upper surface of said recessed sacrificial gate structure is positioned at a level below a level of said upper surface of said raised isolation structure;
with said recessed sacrificial gate structure in position, performing at least one third etching process to reduce a thickness of a portion of said raised isolation structure in an area under said partial gate cavity such that an upper surface of said reduced thickness portion of said raised isolation structure is positioned at a level that is below said upper surface of said recessed sacrificial gate electrode;
after performing said at least one third etching process, removing at least said recessed sacrificial gate structure so as to define a full gate cavity; and
forming a replacement gate structure in said full gate cavity.

13. A method of forming a FinFET transistor above a semiconductor substrate, said transistor comprising at least one fin, wherein the method comprises:
performing at least one etching process so as to define said at least one fin in said substrate;
forming a raised isolation structure with a recess formed therein above said substrate, wherein said recess has a bottom surface that is positioned below an upper surface of said raised isolation structure and an interior perimeter surface, and wherein said bottom surface of said recess exposes at least a portion of a sidewall of said at least one fin;
forming a gate structure above said at least one fin;
forming a plurality of spaced-apart buried fin contact structures within said recess, said buried fin contact structures being formed in said recess on opposite sides of said gate structure, wherein each of said buried fin contact structures is conductively coupled to said at least one fin and has a substantially planar upper surface that is positioned level with or below said upper surface of said raised isolation structure, wherein forming said plurality of buried fin contact structures within said recess comprises depositing a layer of conductive material above said raised isolation structure so as to over-fill said recess and performing a timed recess etching process on said layer of conductive material so as to clear said conductive material from above said upper surface of said raised isolation structure and to define said buried fin contact structures having said upper surface that is positioned below said upper surface of said raised isolation structure;
forming at least one layer of insulating material above said plurality of buried fin contact structures and said raised isolation structure; and
forming a plurality of source/drain contact structures in said at least one layer of insulating material, wherein each of said source/drain contact structures is conductively coupled to one of said plurality of buried fin contact structures.

14. The method of claim 13, wherein said buried fin contact structures further comprise an outer perimeter surface, and wherein said plurality of buried fin contact structures are formed such that the outer perimeter surface of each of said buried fin contact structures contacts at least a portion of said interior perimeter surface of said recess in said raised isolation structure.

15. The method of claim 14, wherein each of said buried fin contact structures is formed such that said outer perimeter surface of said buried fin contact structures contacts said interior perimeter surface of said recess and a sidewall spacer formed adjacent said gate structure.

16. The method of claim 13, wherein forming said plurality of source/drain contact structures comprises forming a plurality of post-type source/drain contact structures.

17. The method of claim 13, wherein forming said plurality of source/drain contact structures comprises forming at least four post-type source/drain contact structures, wherein two of said at least four post-type contact structures are conductively coupled to one of said buried fin contact structures.

18. The method of claim 13, wherein said gate structure is a sacrificial gate structure and wherein, prior to forming said plurality of spaced-apart buried fin contact structures, the method further comprises:
performing at least one second etching process to remove a portion of at least a sacrificial gate electrode of said sacrificial gate structure so as to thereby define a recessed sacrificial gate structure and to define a partial gate cavity, wherein said at least one second etching process is performed such that an upper surface of said recessed sacrificial gate structure is positioned at a level below a level of said upper surface of said raised isolation structure;
with said recessed sacrificial gate structure in position, performing at least one third etching process to reduce a thickness of a portion of said raised isolation structure in an area under said partial gate cavity such that an upper surface of said reduced thickness portion of said raised isolation structure is positioned at a level that is below said upper surface of said recessed sacrificial gate electrode;

after performing said at least one third etching process, removing at least said recessed sacrificial gate structure so as to define a full gate cavity; and forming a replacement gate structure in said full gate cavity.

19. A method of forming a FinFET transistor above a semiconductor substrate, said transistor comprising at least one fin, wherein the method comprises:

performing at least one etching process so as to define said at least one fin in said substrate;

forming a raised isolation structure with a recess formed therein above said substrate, wherein said recess has a bottom surface that is positioned below an upper surface of said raised isolation structure and an interior perimeter surface, and wherein said bottom surface of said recess exposes at least a portion of said at least one fin;

forming a gate structure having an outer sidewall spacer positioned adjacent thereto above said at least one fin;

forming a plurality of spaced-apart buried fin contact structures within said recess, said buried fin contact structures being formed in said recess on opposite sides of said gate structure, wherein each of said buried fin contact structures is conductively coupled to said at least one fin and has an upper surface that is positioned level with or below said upper surface of said raised isolation structure and an outer perimeter surface, at least a portion of said outer perimeter surface of each of said buried fin contact structures contacts at least a portion of said interior perimeter surface of said recess in said raised isolation structure and said outer sidewall spacer formed adjacent said gate structure, and forming said plurality of buried fin contact structures within said recess comprises depositing a layer of conductive material above said raised isolation structure so as to over-fill said recess and performing a timed recess etching process on said layer of conductive material so as to clear said conductive material from above said upper surface of said raised isolation structure and to define said buried fin contact structures having said upper surface that is positioned below said upper surface of said raised isolation structure;

forming at least one layer of insulating material above said plurality of buried fin contact structures and said raised isolation structure; and forming a plurality of post-type source/drain contact structures in said at least one layer of insulating material, wherein each of said source/drain contact structures is conductively coupled to one of said plurality of buried fin contact structures.

20. The method of claim 19, wherein forming said plurality of source/drain contact structures comprises forming at least four post-type source/drain contact structures, wherein two of said at least four post-type source/drain contact structures are conductively coupled to one of said buried fin contact structures.

21. The method of claim 19, wherein said gate structure is a sacrificial gate structure and wherein, prior to forming said plurality of spaced-apart buried fin contact structures, the method further comprises:

performing at least one second etching process to remove a portion of at least a sacrificial gate electrode of said sacrificial gate structure so as to thereby define a recessed sacrificial gate structure and to define a partial gate cavity, wherein said at least one second etching process is performed such that an upper surface of said recessed sacrificial gate structure is positioned at a level below a level of said upper surface of said raised isolation structure;

with said recessed sacrificial gate structure in position, performing at least one third etching process to reduce a thickness of a portion of said raised isolation structure in an area under said partial gate cavity such that an upper surface of said reduced thickness portion of said raised isolation structure is positioned at a level that is below said upper surface of said recessed sacrificial gate electrode;

after performing said at least one third etching process, removing at least said recessed sacrificial gate structure so as to define a full gate cavity; and forming a replacement gate structure in said full gate cavity.

\* \* \* \* \*